United States Patent [19]

Nilssen

[11] Patent Number: 5,214,355
[45] Date of Patent: May 25, 1993

[54] INSTANT-START ELECTRONIC BALLAST

[76] Inventor: Ole K. Nilssen, Caesar Dr., Barrington, Ill. 60010

[21] Appl. No.: 806,676

[22] Filed: Dec. 13, 1991

Related U.S. Application Data

[63] Continuation-in-part of Ser. No. 663,566, Mar. 4, 1991, Pat. No. 5,185,560, which is a continuation-in-part of Ser. No. 787,692, Oct. 15, 1985, abandoned, which is a continuation-in-part of Ser. No. 644,155, Aug. 27, 1984, abandoned, which is a continuation-in-part of Ser. No. 555,426, Nov. 23, 1983, abandoned, which is a continuation-in-part of Ser. No. 178,107, Aug. 14, 1980, abandoned, which is a continuation-in-part of Ser. No. 973,741, Dec. 28, 1978, abandoned, which is a continuation-in-part of Ser. No. 890,586, Mar. 20, 1978, Pat. No. 4,184,128.

[51] Int. Cl.$^5$ .............................................. H05B 41/29
[52] U.S. Cl. ................................ 315/219; 315/189; 315/193; 315/228; 315/323; 315/324; 315/DIG. 5
[58] Field of Search ............... 315/189, 190, 193, 219, 315/224, 228, 231, 240, 313, 323, 324, 326, 362, DIG. 5, DIG. 7

[56] References Cited

U.S. PATENT DOCUMENTS 4,350,929 9/1982 Katoogi ........................ 315/290 X
4,751,432 6/1988 Van Delm ....................... 315/193 X Primary Examiner—David Mis

[57] ABSTRACT

A half-bridge inverter is powered from a constant-magnitude DC supply voltage and provides at the inverter's output a first AC output voltage that is describable as a modified squarewave voltage. This first AC voltage is applied across a series-combination of a tank inductor and a tank capacitor, the junction between which is clamped to the DC supply voltage. As a result, a second AC voltage gets established across the tank capacitor; which second AC voltage is also describable as a modified squarewave voltage. However, the phasing of the second AC voltage is delayed by roughly 90° degrees with respect to the first AC voltage; which results in the voltage across the tank inductor being of approximately sinusoidal waveform. A first and a second fluorescent lamp is connected in series with a first and a second ballast capacitor, respectively; and the two lamp-capacitor series-combinations are parallel-connected across the inductor, thereby resulting in an approximately sinusoidal current being provided to the lamps. To provide for enhanced instant-start lamp ignition, an auxiliary capacitor is connected across the tank capacitor for the initial 100 milli-seconds; which has the effect of providing more power to the lamps during the brief ignition period.

29 Claims, 11 Drawing Sheets

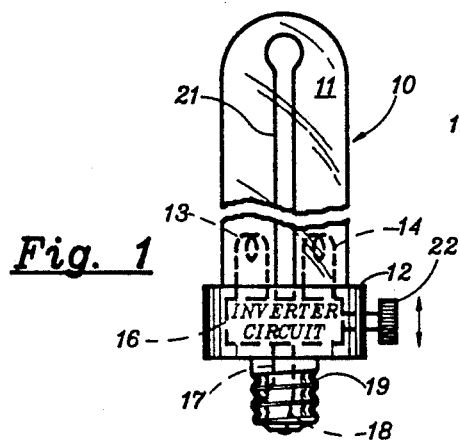
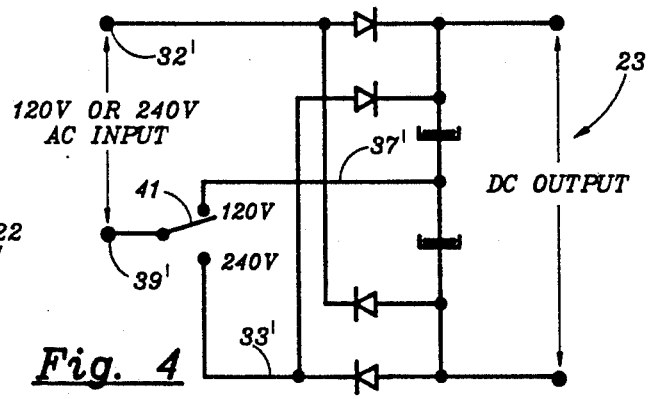
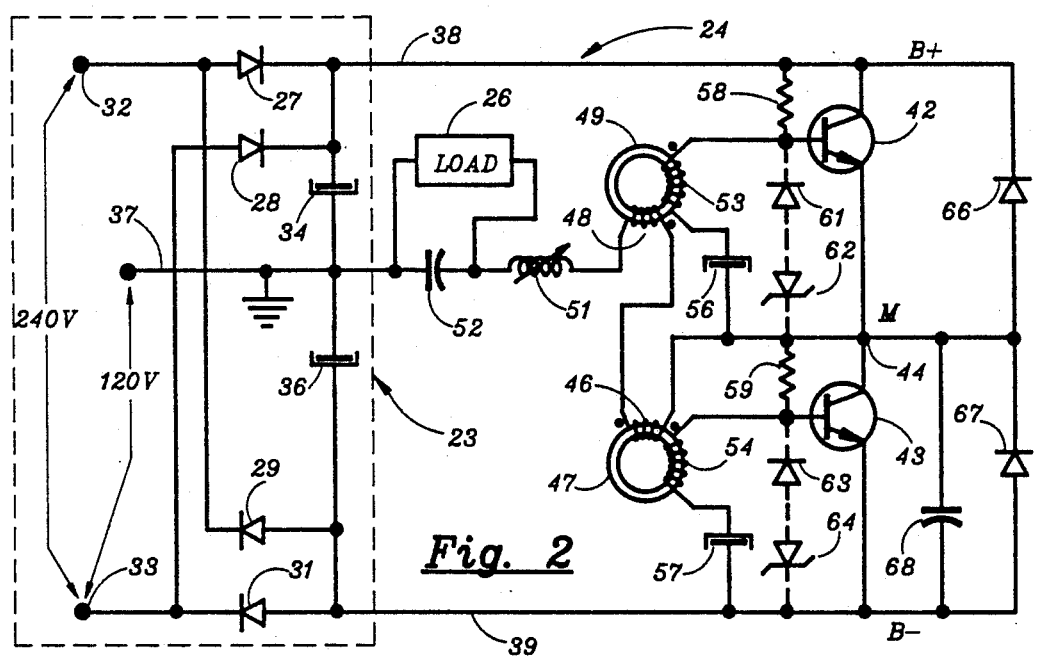
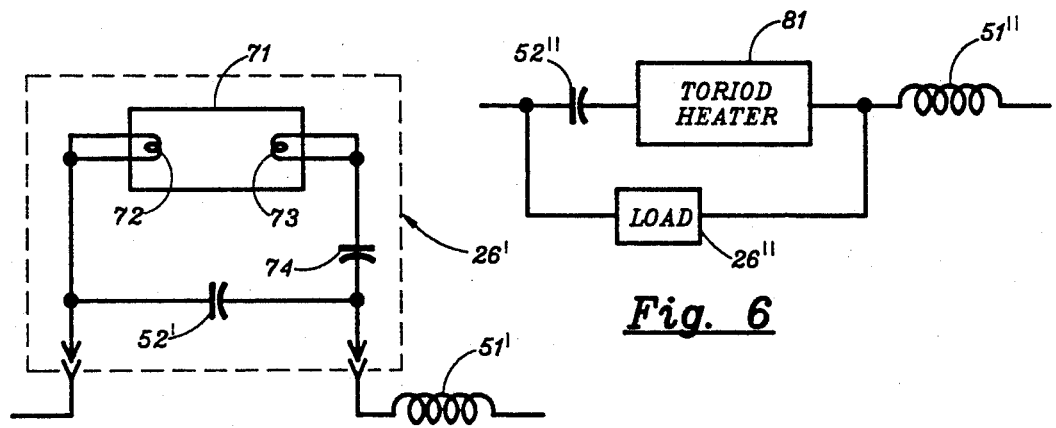

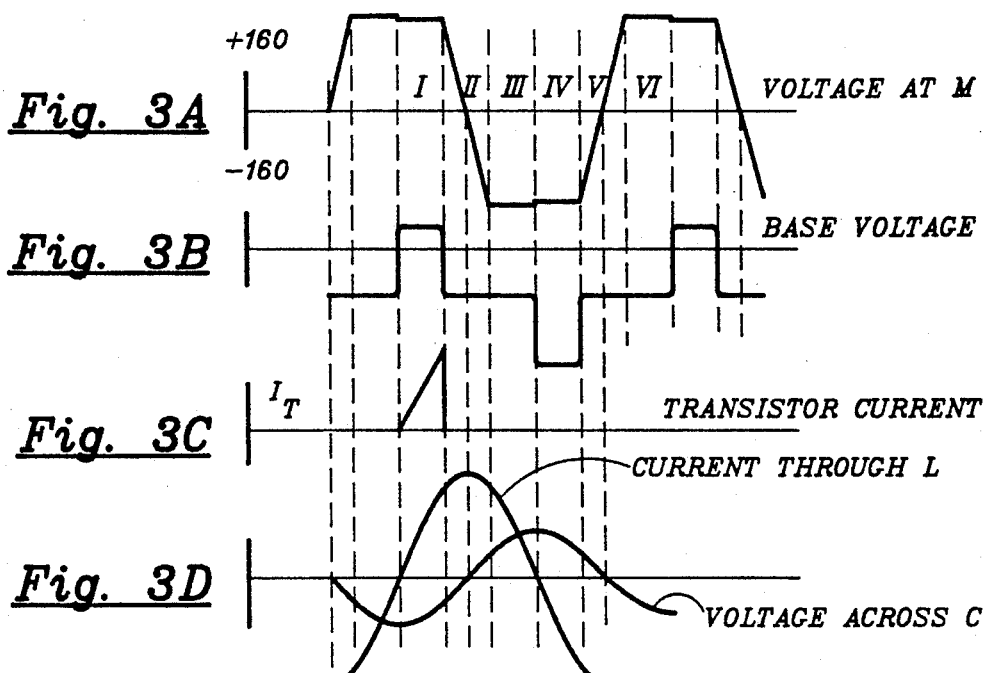
Fig. 3A  VOLTAGE AT M
Fig. 3B  BASE VOLTAGE
Fig. 3C  TRANSISTOR CURRENT
Fig. 3D  CURRENT THROUGH L / VOLTAGE ACROSS C
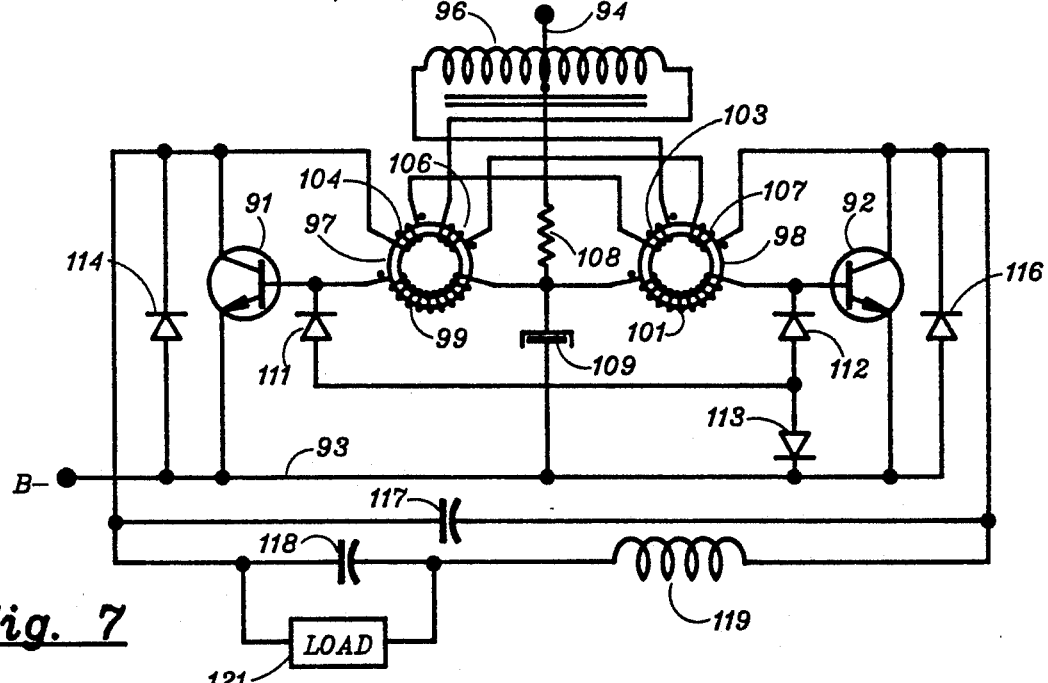
Fig. 7
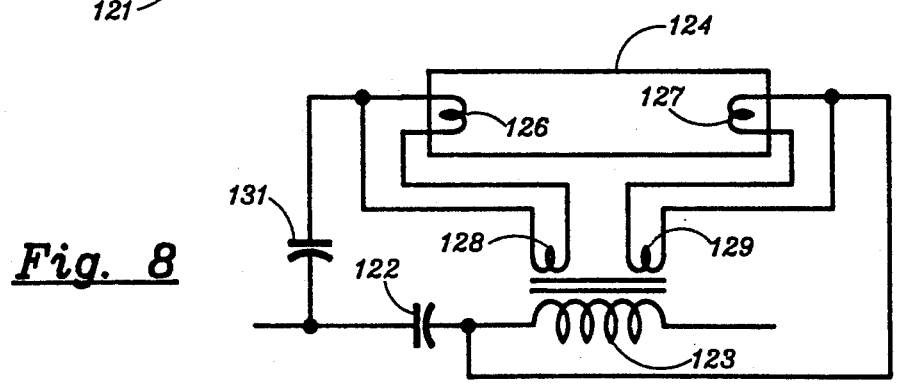
Fig. 8

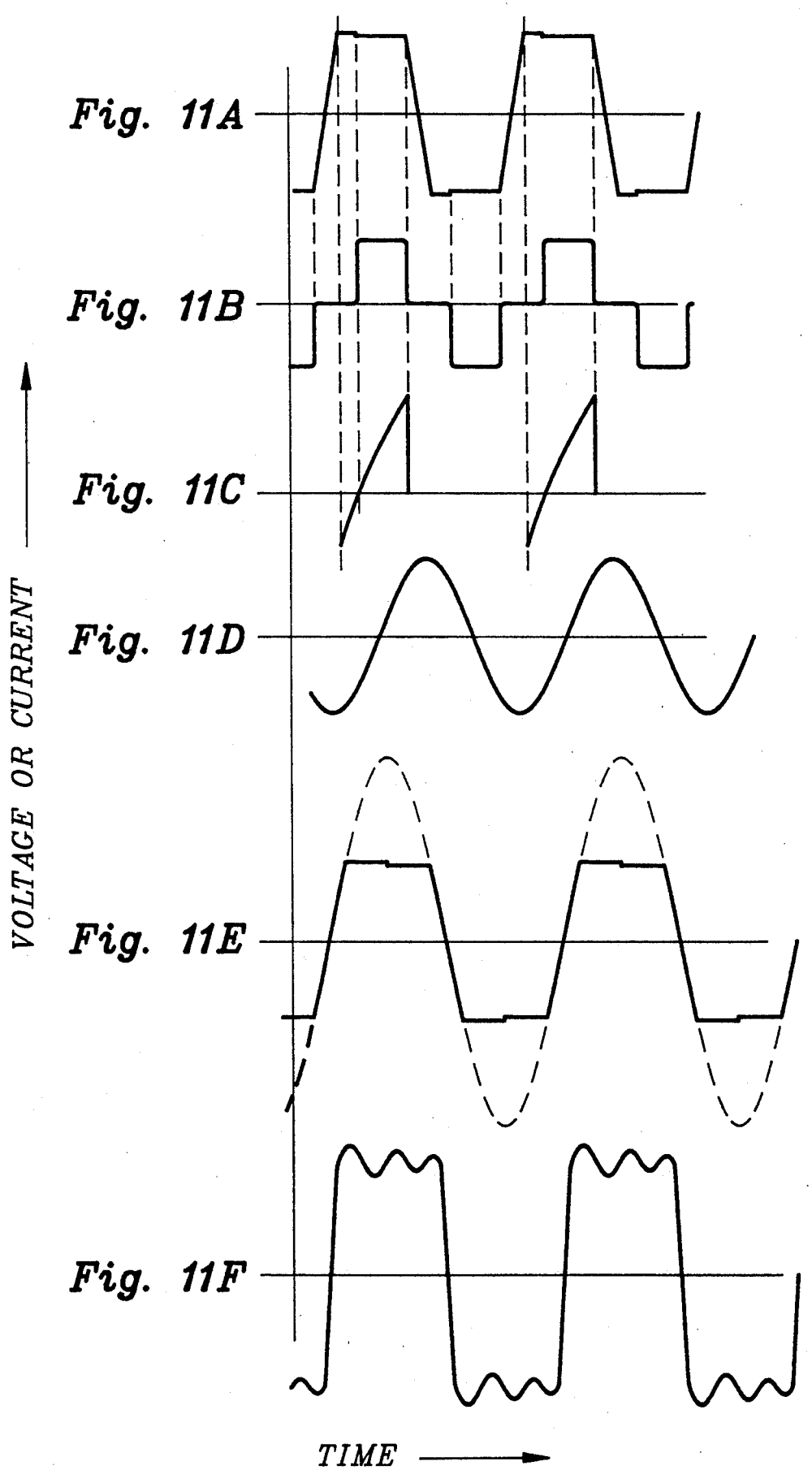

VOLTAGE OR CURRENT

TIME

INSTANT-START ELECTRONIC BALLAST

RELATED APPLICATIONS AND PATENTS

This is a continuation-in-part of Ser. No. 07/663,566 filed Mar. 4, 1991, now U.S. Pat. No. 5,185,560; which is a continuation-in-part of application Ser. No. 06/787,692 filed Oct. 15, 1985, now abandoned; which is a continuation of application Ser. No. 06/644,155 filed Aug. 27, 1984; which is a continuation of application Ser. No. 06/555,426 filed Nov. 23, 1983; which is a continuation of application Ser. No. 06/178,107 filed Aug. 14, 1980, now abandoned; which a continuation-in-part of application Ser. No. 05/973,741 filed Dec. 28, 1978, now abandoned; which is a continuation-in-part of application Ser. No. 05/890,586 filed Mar. 20, 1978, now U.S. Pat. No. 4,184,128.

Field of Invention

BACKGROUND OF THE INVENTION

Otherwise, reference is made to the following U.S. Pat. No. 4,634,932 to Nilssen; U.S. Pat. No. 4,677,345 to Nilssen; and U.S. Pat. No. 4,857,806 to Nilssen.

This invention relates to ballasting means for gas discharge lamps, especially for Instant-Start fluorescent lamps.

Elements of Prior Art

Various forms of starting aid means have been found to facilitate the ignition of Rapid-Start fluorescent lamps. However, the starting aid means found effective for Rapid-Start lamps have little if any useful effect on Instant-Start lamps; and no effective starting aid means has been found for Instant-Start lamps.

SUMMARY OF THE INVENTION

Objects of the Invention

An object of the present invention is that of providing cost-effective ballast means for fluorescent lamps.

This as well as other objects, features and advantages of the present invention will become apparent from the following description and claims.

BRIEF DESCRIPTION OF THE INVENTION

It has been found that, to properly instant-start a typical fluorescent lamp, more than twice normal operating power has to be supplied to the lamp during the ignition process; which ignition process generally should be accomplished in less than 100 milli-seconds. In effect, this additional power is being used for generating a hot spot on each of the thermionic cathodes. After the hot spot is formed, the cathode voltage drop diminishes and the lamp power assumes its normal operating level.

In a preferred embodiment of instant invention, to reduce the amount of power required for igniting plural Instant-Start fluorescent lamps, a sequencing procedure is used. In particular, in a two-lamp Instant-Start ("IS") ballast, on initial power-up, a short circuit is placed across one of the lamps for a period of about 100 milli-seconds. After that length of time, the other lamp has fully ignited and is now drawing no more than its normal operating power. At that point, the short circuit is removed from the one lamp; which thereupon ignites.

In one version of the preferred embodiment, the lamps are parallel-operated; and the initial shorting of one of the lamps reduces the maximum amount of power that must be delivered from the ballast by about one fourth versus what it otherwise would have had to be. With more than two lamps, the reduction is even larger. With one-by-one sequencing in a four-lamp ballast, the amount of ballast power required is reduced by nearly half.

In another version of the preferred embodiment, the lamps are series-operated; and the initial shorting of one of the lamps also reduces the maximum amount of power that must be delivered from the ballast by about one fourth versus what it otherwise would have had to be. However, this series-lamp version has the additional advantage of reducing the Volt-Ampere product required for proper lamp ignition. In particular, for two lamps in series, the magnitude of the ballast's required starting voltage has been reduced by about one third. For four sequentially ignited lamps in series, the required starting voltage is reduced by more than half.

In an alternative preferred embodiment, upon initial power-up, an auxiliary element is connected within the ballast; which auxiliary element is functional on a temporary basis to increase ballast power output and therefore to shorten lamp ignition time. After about 100 milli-seconds, this auxiliary component is disconnected.

Otherwise and by way of example, in one version of one of the preferred embodiments, a half-bridge inverter is powered from a DC rail by a constant-magnitude DC supply voltage and provides at the inverter's output terminals a first AC output voltage that is describable as a modified squarewave voltage. This first AC voltage, whose waveshape is shaped away from that of an ordinary squarewave voltage by using a slow-down capacitor of substantial capacitance connected directly across the inverter's output terminals, is applied across a series-combination of a tank inductor and a tank capacitor; which tank inductor and tank capacitor are connected together at a junction; which junction, in turn, is connected with the DC rail by way of a pair of clamping rectifiers; which means that the voltage developing across the tank capacitor will be clamped by the DC supply voltage. As a result, a second AC voltage gets established across the tank capacitor; which second AC voltage is also describable as being a modified squarewave voltage. However, the phasing of the second AC voltage is delayed by approximately 90° degrees with respect to the first AC voltage; which results in the voltage across the tank inductor being of approximately sinusoidal waveform.

A first and a second fluorescent lamp is connected in series with a first and a second ballast capacitor, respectively; and the two lamp-capacitor series-combinations are parallel-connected across the tank inductor, thereby resulting in an approximately sinusoidal current being provided to the lamps.

To provide for enhanced instant-start lamp ignition, an auxiliary capacitor is connected across the tank capacitor for the initial 100 milli-seconds; which has the effect of providing more power to the lamps during the brief ignition period.

The DC supply voltage is attained and regulated by way of an up-converter principally consisting of an energy-storing inductor connected between a field-effect transistor (i.e., a FET) and the DC output terminals of a bridge rectifier powered from ordinary 120 Volt/60 Hz power line voltage. The FET is caused to enter its ON state (thereby causing the energy-storing inductor to be charged-up) by having its gate-source input capacitance being provided with a certain amount of charge (i.e., sufficient to cause the FET to switch into its ON-state) each time one of the transistors in the self-oscillating half-bridge inverter is switched OFF. After a delay of about 10 micro-seconds after having been switched ON, an automatic timing circuit causes a short circuit to be placed across the gate-source input capacitance for a time just long enough to drain away the gate-source charge, thereby causing the FET to switch OFF; thereby, in turn, causing the energy stored in the energy-storing inductor to be discharged into an energy-storing capacitor connected across the DC rail. To minimize the harmonics associated with the wave-from of the current drawn from the power line, the delay is decreased with increasing instantaneous magnitude of the power line voltage. Also, to provide for effective regulation of the magnitude of the DC supply voltage, the delay is decreased as the magnitude of the DC supply voltage exceeds a predetermined level.

BRIEF DESCRIPTION OF THE DRAWINGS

FIG. 1 is a front elevation of a fluorescent lamp unit adapted for screw-in insertion into a standard Edison incandescent socket;

FIG. 2 is a schematic diagram illustrating the essential features of a push-pull inverter circuit particularly suitable for energizing the lamp unit of FIG. 1;

FIG. 3A-3D is a set of waveform diagrams of certain significant voltages and currents occurring in the circuit of FIG. 2;

FIG. 4 is a schematic diagram of a DC power supply connectable to both 120 and 240 volt AC inputs;

FIG. 5 is a schematic diagram which illustrates the connection of a non-self-ballasted gas discharge lamp unit to the FIG. 2 inverter circuit;

FIG. 6 is a schematic diagram which illustrates the use of a toroid heater for regulation of the inverter output;

FIG. 7 is an alternate form of push-pull inverter circuit according to one aspect of the present invention;

FIG. 8 is a schematic diagram showing the connection of a gas discharge lamp of the "rapid-start" type to an inductor-capacitor-loaded inverter according to the present invention;

FIG. 11A-11J show various voltage and current waveforms associated with the circuit arrangement of FIG. 9.

DESCRIPTION OF BASIC CIRCUITS AND PREFERRED EMBODIMENTS

Figures 9, 10:
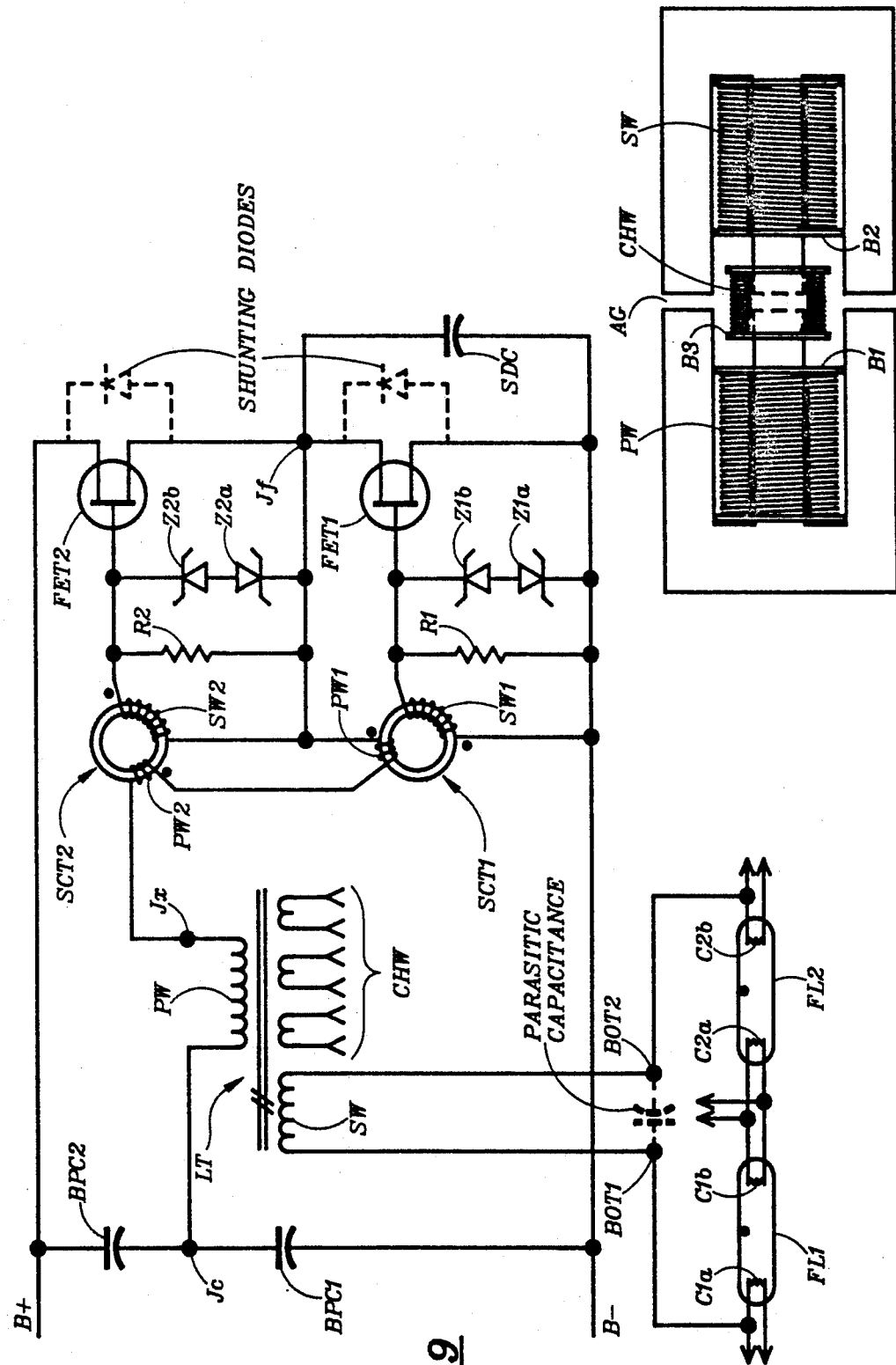
FIG. 9 is a schematic diagram illustrating an inverter ballast circuit arrangement wherein a pair of series-connected fluorescent lamps is powered, by way of a reactance transformer, from an inverter output voltage having a trapezoidal (i.e. truncated sinewave) waveform like that of FIG. 3A.
FIG. 10 is a schematic illustration of the reactance transformer used in the circuit arrangement of FIG. 9.

FIG. 1 illustrates a screw-in gas discharge lamp unit 10 comprising a folded fluorescent lamp 11 suitably secured to an integral base 12. The lamp comprises two cathodes 13, 14 which are supplied with the requisite high operating voltage from a frequency-converting power supply and ballasting circuit 16; which, because of its compact size, conveniently fits within the base 12.

The inverter circuit 16 is connected by leads 17, 18 to a screw-type plug 19 adapted for screw-in insertion into a standard Edison-type incandescent lamp socket at which ordinary 120 Volt/60 Hz power line voltage is available. A ground plane comprising a wire or metallic strip 21 is disposed adjacent a portion of the fluorescent lamp 11 as a starting aid. Finally, a manually rotatable external knob 22 is connected to a shaft for mechanical adjustment of the air gap of a ferrite core inductor to vary the inductance value thereof in order to effect adjustment of the inverter voltage output connected to electrodes 13, 14 for controlled variation of the lamp illumination intensity.

With reference to FIG. 2, a power supply 23, connected to a conventional AC input, provides a DC output for supplying a high-efficiency inverter circuit 24. The inverter is operable to provide a high voltage to an external load 26, which may comprise a gas discharge device such as the fluorescent lamp 11 of FIG. 1.

The power supply 23 comprises bridge rectifier having four diodes 27, 28, 29 and 31 connectable to a 240 volt AC supply at terminals 32, 33. Capacitors 34, 36 are connected between a ground line 37 (in turn directly connected to the inverter 24) and to a B+line 38 and a B- line 39, respectively. The power supply 23 also comprises a voltage doubler and rectifier optionally connectable to a 120 volt AC input taken between the ground line 37 and terminal 33 or 32. The voltage doubler and rectifier means provides a direct electrical connection by way of line 37 between one of the 120 volt AC power input lines and the inverter 24, as shown in FIG. 2. The bridge rectifier and the voltage doubler and rectifier provide substantially the same DC output voltage to the inverter 24 whether the AC input is 120 or 240 volts. Typical voltages are +160 volts on the B+line 38 and −160 volts on the B- line 39.

With additional reference to FIG. 4, which shows an alternate power supply 23', the AC input, whether 120 or 240 volts, is provided at terminals 32' and 39. Terminal 39 is in turn connected through a single-pole double-throw selector switch 41 to terminal 37' (for 120 volt operation) or terminal 33' (for 240 volt operation). In all other respects, power supplies 23 and 23' are identical.

The inverter circuit 24 of FIG. 2 is a half-bridge inverter comprising transistors 42, 43 connected in series across the DC voltage output of the power supply 23 on B+and B−lines 38 and 39, respectively. The collector of transistor 42 is connected to the B+line 38, the emitter of transistor 42 and the collector of transistor 43 are connected to a midpoint line 44 (designated "M") and the emitter of transistor 43 is connected to the B-line 39. The midpoint line 44 is in turn connected to the ground line 37 through primary winding 46 of a toroidal saturable core transformer 47, a primary winding 48 on an identical transformer 49, an inductor 51 and a series-connected capacitor 52. The inductor 51 and capacitor 52 are energized upon alternate transistor conduction in a manner to be described later.

An external load 26 is preferably taken off capacitor 52, as shown in FIG. 2. The inductor 51, preferably a known ferrite core inductor, has an inductance variable by mechanical adjustment of the air gap in order to effect variation in the level of the inductor and capacitor voltage and hence the power available to the load, as will be described. When the load is a gas discharge lamp such as lamp 11 in FIG. 1, variation in this inductance upon rotation of knob 22 accomplishes a lamp dimming effect.

Drive current to the base terminals of transistors 42 and 43 is provided by secondary windings 53, 54 of transformers 49, 47, respectively. Winding 53 is also connected to midpoint lead 44 through a bias capacitor 56, while winding 54 is connected to the B−lead 39 through an identical bias capacitor 57. The base terminals of transistors 42 and 43 are also connected to lines 38 and 44 through bias resistors 58 and 59, respectively. For a purpose to be described later, the base of transistor 42 can be optionally connected to a diode 61 and a series Zener diode 64 in turn connected to the midpoint line 44; similarly, a diode 63 and series Zener diode 64 in turn connected to the B−line 39 can be connected to the base of transistor 43. Shunt diodes 66 and 67 are connected across the collector-emitter terminals of transistors 42 and 43, respectively. Finally, a capacitor 68 is connected across the collector-emitter terminals of transistor 43 to restrain the rate of voltage rise across those terminals, as will be seen presently.

The operation of the circuit of FIG. 2 can best be understood with additional reference to FIG. 3, which illustrates significant portions of the waveforms of the voltage at midpoint M (FIG. 3A), the base-emitter voltage on transistor 42 (FIG. 3B), the current through transistor 42 (FIG. 3C), and the capacitor 52 voltage and the inductor 51 current (FIG. 3D).

Assuming that transistor 42 is first to be triggered into conduction, current flows from the B+line 38 through windings 46 and 38 and the inductor 51 to charge capacitor 52 and returns through capacitor 34 (refer to the time period designated I in FIG. 3). When the saturable inductor 49 saturates at the end of period I, drive current to the base of transistor 42 will terminate, causing voltage on the base of the transistor to drop to the negative voltage stored on the bias capacitor 56 in a manner to be described, causing this transistor to become nonconductive. As shown in FIG. 3c, current-flow in transistor 43 terminates at the end of period I.

Because the current through inductor 51 cannot change instantaneously, current will flow from the B−bus 39 through capacitor 68, causing the voltage at midpoint line 44 to drop to −160 volts (period II in FIG. 3). The capacitor 68 restrains the rate of voltage change across the collector and emitter terminals of transistor 42. The current through the inductor 51 reaches its maximum value when the voltage at the midpoint line 44 is zero. During period III, the current will continue to flow through inductor 51 but will be supplied from the B− bus through the shunt diode 67. It will be appreciated that during the latter half of period II and all of period III, positive current is being drawn from a negative voltage; which, in reality, means that energy is being returned to the power supply through a path of relatively low impedance.

When the inductor current reaches zero at the start of period IV, the current through the primary winding 46 of the saturable inductor 47 will cause a current to flow out of its secondary winding 54 to cause transistor 43 to become conductive, thereby causing a reversal in the direction of current through inductor 51 and capacitor 52. When transformer 47 saturates at the end of period IV, the drive current to the base of transistor 43 terminates and the current through inductor 51 will be supplied through capacitor 68, causing the voltage at midpoint line 44 to rise (period V). When the voltage at the midpoint line M reaches 160 volts, the current will then flow through shunt diode 66 (period VI). The cycle is then repeated.

As seen in FIG. 3, saturable transformers 47, 49 provide transistor drive current only after the current through inductor 51 has diminished to zero. Further, the transistor drive current is terminated before the current through inductor 51 has reached its maximum amplitude. This coordination of base drive current and inductor current is achieved because of the series-connection between the inductor 51 and the primary windings 46, 48 of saturable transformers 47, 49, respectively.

The series-connected combination of the inductor 51 and the capacitor 52 is energized upon the alternate conduction of transistors 42 and 43. With a large value of capacitance of capacitor 52, very little voltage will be developed across its terminals. As the value of this capacitance is decreased, however, the voltage across this capacitor will increase. As the value of the capacitor 52 is reduced to achieve resonance with the inductor 51, the voltage on the capacitor will rise and become infinite in a loss-free circuit operating under ideal conditions.

It has been found desirable to regulate the transistor inversion frequency, determined mainly by the saturation time of the saturable inductors 47, 49, to be equel to or higher than the natural resonance frequency of the inductor and capacitor combination in order to provide a high voltage output to external load 26. A high voltage across capacitor 52 is efficiently developed as the transistor inversion frequency approaches the natural resonant frequency of the inductor 51 and capacitor 52 combination.

Stated another way, the conduction period of each transistor is desirably shorter in duration than one quarter of the full period corresponding to the natural resonant frequency of the inductor and capacitor combination. When the inverter 24 is used with a self-ballasted gas discharge lamp unit, it has been found that the inversion frequency can be at least equal to the natural resonant frequency of the tank circuit. If the capacitance value of capacitor 52 is reduced still further beyond the resonance point, unacceptably high transistor currents will be experienced during transistor switching and transistor burn-out will occur.

It will be appreciated that the sizing of capacitor 52 is determined by the application of the inverter circuit 24. Variation in the values of the capacitor 52 and the inductor 51 will determine the voltages developed in the inductor-capacitor tank circuit. The external load 26 may be connected in circuit with the inductor 51 (by a winding on the inductor, for example) and the capacitor may be omitted entirely. If the combined circuit loading of the inductor 51 and the external load 26 has an effective inductance of value sufficient to effect periodic energy storage for self-sustained transistor inversion, the current feedback provided by the saturable inductors 47, 49 will effect alternate transistor conduction without the need for additional voltage feedback. When the capacitor 52 is omitted, the power supply 23 provides a direct electrical connection between one of the AC power input lines and the inverter load circuit.

Because the voltages across transistors 42, 43 are relatively low (due to the effect of capacitors 34, 36), the half-bridge inverter 24 is very reliable. The absence of switching transients minimizes chances of transistor burn-out.

The inverter circuit 24 comprises means for supplying reverse bias to the conducting transistor upon saturation of its associated saturable inductor. For this purpose, the capacitors 56 and 57 are charged to negative voltages as a result of reset current flowing into secondary windings 53, 54 from the bases of transistors 42, 43, respectively. This reverse current rapidly turns off a conducting transistor to increase its switching speed and to achieve inverter circuit efficiency in a manner described more fully in my co-pending U.S. patent application Ser. No. 103,624 filed Dec. 14, 1979 and entitled "Bias Control for High Efficiency Inverter Circuit" (now U.S. Pat. No. 4,307,353). The more negative the voltage on the bias capacitors 56 and 57, the more rapidly charges are swept out of the bases of their associated transistors upon transistor turn-off.

When a transistor base-emitter junction is reversely biased, it exhibits the characteristics of a Zener diode having a reverse breakdown voltage on the order of 8 to 14 Volt for transistors typically used in high-voltage inverters. As an alternative, to provide a negative voltage smaller in magnitude on the base lead of typical transistor 42 during reset operation, the optional diode 61 and Zener diode 62 combination can be used. For large values of the bias capacitor 56, the base voltage will be substantially constant.

If the load 26 comprises a gas discharge lamp, the voltage across the capacitor 52 will be reduced once the lamp is ignited to prevent voltages on the inductor 51 and the capacitor 52 from reaching destructive levels. Such a lamp provides an initial time delay during which a high voltage, suitable for instant starting, is available.

FIG. 5 illustrates the use of an alternate load 26' adapted for plug-in connection to an inverter circuit such as shown in FIG. 2. The load 26' consists of a gas discharge lamp 71 having electrodes 72, 73 and connected in series with a capacitor 74. The combination of lamp 71 and capacitor 74 is connected in parallel with a capacitor 52' which serves the same purpose as capacitor 52 in the FIG. 2 circuit. However, when the load 26' is unplugged from the circuit, the inverter stops oscillating and the development of high voltages in the inverter is prevented. The fact that no high voltages are generated by the circuit if the lamp is disconnected while the circuit is oscillating is important for safety reasons.

FIG. 6 illustrates a capacitor 52" connected in series with an inductor 51" through a heater 81 suitable for heating the toroidal inductors 47, 49 in accordance with the level of output. The load 26" is connected across the series combination of the capacitor 52" and the toroid heater. The heater 81 is preferably designed to controllably heat the toroidal saturable inductors in order to decrease their saturation flux limit and hence their saturation time. The result is to decrease the periodic transistor conduction time and thereby increase the transistor inversion frequency. When a frequency-dependent impedance means, that is, an inductor or a capacitor, is connected in circuit with the AC voltage output of the inverter, change in the transistor inversion frequency will modify the impedance of the frequency-dependent impedance mean and correspondingly modify the inverter output. Thus as the level of the output increases, the toroid heater 81 is correspondingly energized to effect feedback regulation of the output. Further, transistors 42, 43 of the type used in high voltage inverters dissipate heat during periodic transistor conduction. As an alternative, the toroid heater 81 can use this heat for feedback regulation of the output or control of the temperature of transistors 42, 43.

The frequency dependent impedance means may also be used in a circuit to energize a gas discharge lamp at adjustable illumination levels. Adjustment in the inversion frequency of transistors 42, 43 results in control of the magnitude of the AC current supplied to the lamp. This is preferably accomplished where saturable inductors 47, 49 have adjustable flux densities for control of their saturation time.

FIG. 7 schematically illustrates an alternate form of inverter circuit, shown without the AC to DC power supply connections for simplification. In this Figure, the transistors are connected in parallel rather than in series but the operation is essentially the same as previously described.

In particular, this circuit comprises a pair of alternately conducting transistors 91, 92. The emitter terminals of the transistors are connected to a B−line 93. A B+lead 94 is connected to the center-tap of a transformer 96. In order to provide drive current to the transistors 91, 92 for control of their conduction frequency, saturable inductors 97, 98 have secondary windings 99, 101, respectively, each secondary winding having one end connected to the base of its associated transistor; the other ends are connected to a common terminal 102. One end of transformer 96 is connected to the collector of transistor 91 through a winding 103 on inductor 98 in turn connected in series with a winding 104 on inductor 97. Likewise, the other end of transformer 96 is connected to the collector of transistor 92 through a winding 106 on inductor 97 in series with another winding 107 on inductor 98.

The B+terminal is connected to terminal 102 through a bias resistor 108. A bias capacitor 109 connects terminal 102 to the B−lead 93. This resistor and capacitor serve the same function as resistors 58, 59 and capacitors 56, 57 in the FIG. 2 circuit.

The bases of transistors 91, 92 are connected by diodes 111, 112, respectively, to a common Zener diode 113 in turn connected to the B−lead 93. The common Zener diode 113 serves the same function as individual Zener diodes 62, 64 in FIG. 2.

Shunt diodes 114, 116 are connected across the collector-emitter terminals of transistors 91, 92, respectively.

A capacitor 117 connecting the collectors of transistors 91, 92 restrains the rate of voltage rise on the collectors in a manner similar to the collector-emitter capacitor 68 in FIG. 2.

Inductive-capacitive loading of the FIG. 7 inverter is accomplished by a capacitor 118 connected in series with with an inductor 119, the combination being connected across the collectors of the transistors 91, 92. A load 121 is connected across the capacitor 118.

FIG. 8 illustrates how an inverter loaded with a series capacitor 122 and inductor 123 can be used to energize a "rapid-start" fluorescent lamp 124 (the details of the inverter circuit being omitted for simplification). The lamp 124 has a pair of cathodes 126, 127 connected across the capacitor 122 for supply of operating voltage in a manner identical to that previously described. In addition, the inductor 123 comprises a pair of magnetically-coupled auxiliary windings 128, 129 for electrically heating the cathodes 126, 127, respectively. A small capacitor 131 is connected in series with lamp 124.

FIG. 9 shows an embodiment of the present invention that is expressly aimed at an alternative way of taking advantage of the fact that the inverter output voltage of the inverter circuit arrangement of FIG. 2 has the particular trapezoidal waveshape illustrated by FIG. 3A.

In FIG. 9, a DC supply voltage of about-320 Volt is assumed to be provided between a B−bus and a B+bus.

A first high-frequency bypass capacitor BPC1 is connected between the B−bus and a junction Jc; and a second high-frequency bypass capacitor BPC2 is connected between junction Jc and the B+bus. The source of a first field effect transistor FET1 is connected with the B−bus, while the drain of this same transistor is connected with a junction Jf. The source of a second field effect transistor FET2 is connected with junction Jf, while the drain of this same transistor is connected with the B+bus. As shown in dashed outline, each field effect transistor has a commutating diode built-in between its drain and source. A slow-down capacitor SDC is connected between junction Jf and the B−bus The primary winding PW of a leakage transformer LT is connected between junction Jc and a junction Jx; the primary winding PW1 of a first saturable current transformer SCT1 is series-connected with the primary winding PW2 of a second saturable current transformer SCT2 between junctions Jf and Jx.

A secondary winding SSW1 of transformer SCT1 is connected between the source and gate terminals of FET1; and a secondary winding SW2 of transformer SCT2 is connected between the source and gate terminals of FET2. A resistor R1 is connected across secondary winding SW1; and a resistor R2 is connected across secondary winding SW2. A Zener diode Z1a is connected with its cathode to the source of FET1 and with its anode to the anode of a Zener diode Z1b, whose cathode is connected with the gate of FET1. A Zener diode Z2a is connected with its cathode to the source of FET2 and with its anode to the anode of a Zener diode Z2b, whose cathode is connected with the gate of FET2.

A secondary winding SW of leakage transformer LT is connected between ballast output terminals BOT1 and BOT2.

A first fluorescent lamp FL1 is series-connected with a second fluorescent lamp FL2 to form a series-combination; which series-combination is connected between ballasts output terminals BOT1 and BOT2. Lamp FL1 has a first cathode C1a and a second cathode C1b; while lamp FL2 has a first cathode C2a and a second cathode C2b. Each cathode has two cathode terminals. Each of the terminals of cathode C1b is connected with one of the terminals of cathode C2a. Each cathode's terminals are connected with the terminals of one of three separate cathode heater windings CHW.

The leakage transformer of FIG. 9 is illustrated in further detail in FIG. 10. In particular and by way of example, leakage transformer LT includes a first and a second ferrite core element FC1 and FC2, each of which is an extra long so-called E-core; which E-cores abut each other across an air gap AG. Primary winding PW is wound on a first bobbin B1; and secondary winding SW is wound on a second bobbin B2. Cathode heating windings CHW are wound on a small third bobbin B3; which bobbin B3 is adjustably positioned between bobbins B1 and B2.

The operation of the circuit arrangement of FIG. 9 may best be understood by referring to the voltage and current waveforms of FIGS. 11A to 11F FIG. 11A shows the waveform of the voltage provided at the output of the half-bridge inverter of FIG. 9 during a situation where lamps FL1 and FL2 are being fully powered. In particular, FIG. 11A shows the waveform of the voltage provided at junction Jf as measured with reference to junction Jc. (The voltage at Jx is substantially equal to the voltage at Jf).

This waveform is substantially equal to that of FIG. 3A.

FIG. 11B shows the corresponding waveform of the gate-to-source voltage (i.e. the control voltage) of FET2.

FIG. 11C shows the corresponding drain current flowing through FET2; which is the current drawn by the upper half of the half-bridge inverter from the DC supply voltage (i.e., from the B+bus).

FIG. 11D shows the corresponding current flowing through fluorescent lamps FL1 and FL2.

FIG. 11E shows the waveform of the voltage provided at the output of the half-bridge inverter of FIG. 9 for a situation where ballast output terminals BOT1-/BOT2 are unloaded except for stray (or parasitic) capacitance associated with the wiring extending between ballast output terminals BOT1/BOT2 and lamp cathodes C1a and C2b.

The waveform of FIG. 11E is substantially equal to that of FIG. 11A except for an increase in the duration of each cycle period.

FIG. 11F shows the corresponding open circuit output voltage present across ballast output terminals BOT1 and BOT2.

Figures 11G, 11H, 11I, 11J:
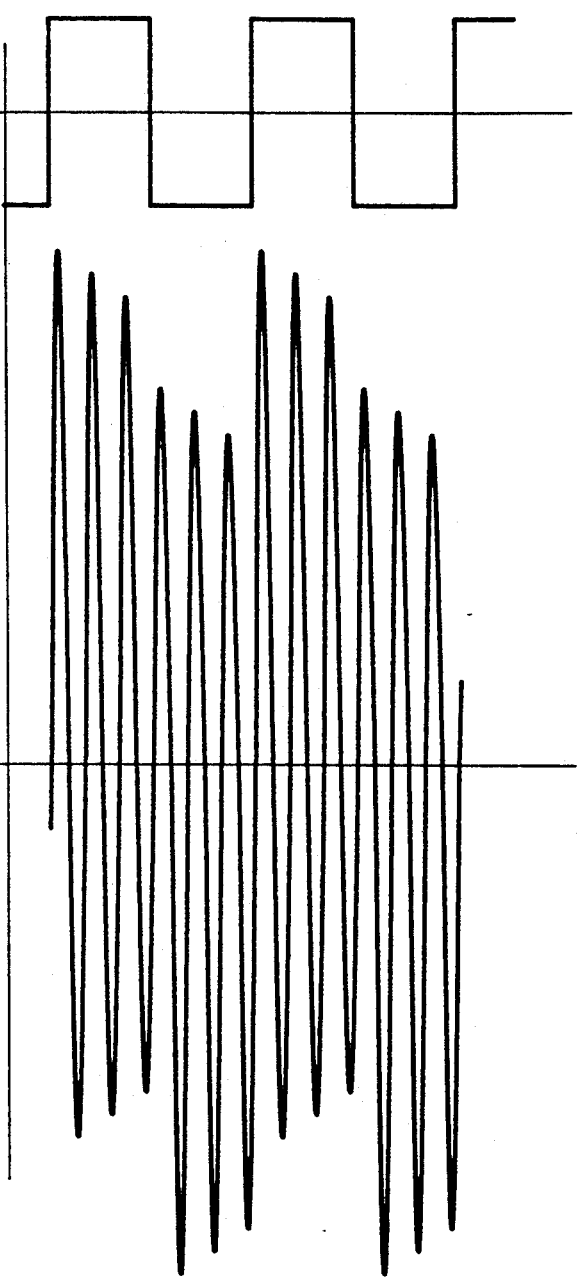

FIG. 11G shows the waveform of the voltage provided at the output of the half-bridge inverter of FIG. 9 for a situation where: (i) slowdown capacitor SDC has been removed; and (ii) ballast output terminals BOT1-/BOT2 are unloaded except for stray (or parasitic) capacitance associated with the wiring extending between ballast output terminals BOT1/BOT2 and lamp cathodes C1a and C2b.

It is noted that the waveform of FIG. 11G is substantially a true squarewave as opposed to the trapezoidal (or truncated sinusoidal) waveforms of FIGS. 11A and 11E.

FIG. 11H shows the waveform of the corresponding voltage present across ballast output terminals BOT1 and BOT2.

FIG. 11I shows the trapezoidal waveform most nearly equal to a given sinusoidal waveform (which trapezoidal waveform can be seen to be closely similar to that of FIG. 1A). That is, the particular trapezoidal waveform shown represents a best fit—as far as a trapezoidal waveform is concerned—to a sinusoidal waveform. This best fit is arrived-at by superimposing a trapezoidal waveform on the given sinusoidal waveform and by varying the shape and/or magnitude of the trapezoidal waveform until a shape and a magnitude are found that provides for the minimum RMS magnitude of the difference in the two waveforms; which minimum difference is shown by the lightly dashed waveform.

FIG. 11J shows the corresponding situation for a squarewave, indicating a much larger RMS magnitude for the resulting minimum difference; which is to say that a squarewave voltage is a much poorer approximation to a sinewave voltage than is a properly chosen trapezoidal voltage.

The basic inverter part of FIG. 9 operates much like the inverter part of FIG. 2, except that the switching transistors are field effect transistors instead of bi-polar transistors.

The loading of the inverter, however, is different. In the circuit of FIG. 9, the inverter's output voltage is applied to the primary winding of a leakage transformer (LT); and the output is drawn from a primary winding of this leakage transformer. In this connection, it is important to notice that a leakage transformer is a transformer wherein there is substantial leakage of magnetic flux between the primary winding and the secondary winding; which is to say that a substantial part of the flux generated by the transformer's primary winding does not link with the transformer's secondary winding.

The flux leakage aspect of transformer LT is illustrated by the structure of FIG. 10. Magnetic flux generated by (and emanating from) primary winding PW passes readily through the high-permeability ferrite of ferrite core FC1. However, as long as secondary winding SW is connected with a load at its output (and/or if there is an air gap, as indeed there is), the flux emanating from the primary winding has to overcome magnetic impedance to flow through the secondary winding; which implies the development of a magnetic potential difference between the legs of the long E-cores—especially between the legs of ferrite core FC1. In turn, this magnetic potential difference causes some of the magnetic flux generated by the primary winding to flow directly between the legs of the E-cores (i.e. directly across the air gap between the legs of the E-cores), thereby not linking with (i.e. flowing through) the secondary winding. Thus, the longer the legs of the E-cores and/or the larger the air gap, the less of the flux generated by the primary winding links with the secondary winding—and conversely. As a result, the magnitude of the current available from the secondary winding is limited by an equivalent internal inductance.

Due to the substantial air gap (AG), the primary winding of leakage transformer LT is capable of storing a substantial amount of inductive energy (just as is the case with inductor 51 of FIG. 2). Stated differently but equivalently, leakage transformer LT has an equivalent input-shunt inductance (existing across the input terminals of its primary or input winding) capable of storing a substantial amount of energy. It also has an equivalent output-series inductance (effectively existing in series with the output terminals of its secondary or output winding) operative to limit the magnitude of the current available from its output. It is important to recognize that the input-shunt inductance is an entity quite separate and apart from the output-series inductance.

Just as in the circuit of FIG. 2, when one of the transistors is switched OFF, the current flowing through primary winding PW can not instantaneously stop flowing. Instead, it must continue to flow until the energy stored in the input-shunt inductance is dissipated and/or discharged. In particular and by way of example, at the moment FET2 is switched OFF, current flows through primary winding PW, entering at the terminal connected with junction Jx and exiting at the terminal connected with junction Jc. Just after the point in time where FET2 is switched OFF, this current will continue to flow, but—since it can not any longer flow through transistor FET2—it must now flow through slow-down capacitor SDC. Thus, the current drawn out of capacitor SDC will cause this capacitor to change its voltage: gradually causing it to decrease from a magnitude of about +160 Volt (which is the magnitude of the DC supply voltage present at the B+bus as referenced-to junction Jc) to about −160 Volt (which is the magnitude of the DC supply voltage present at the B−bus as referended-to junction Jc). Of course, as soon as it reaches about −160 Volt, it gets clamped by the commutating (or shunting, or clamping) diode built-into FET1; which built-in diode corresponds to shunting diode 67 of the FIG. 2 circuit.

The resulting waveform of the inverter's output voltage will be as illustrated by FIGS. 11A and 11E. The slope of the inverter output voltage as it alternatingly changes between −160 Volt and +160 Volt is determined by two principal factors: (i) the value of the input-shunt inductance of primary winding PW; and (ii) the magnitude of slow-down capacitor SDC. The lower the capacitance of the slow-down capacitor, the steeper the slope. The lower the inductance of the input-shunt inductance, the steeper the slope. Without any slow-down capacitor, the slope will be very steep: limited entirely by the basic switching speed of the inverter's transistors; which, for field effect transistors is particularly high (i.e. fast).

In particular, in the circuit of FIG. 9, the relatively modest up- and down- slopes of the inverter's output voltage (see waveforms of FIGS. 11A and 11E)—which are determined by the capacitance of the slow-down capacitor—are chosen to be far lower than the very steep slopes that result when the slow-down capacitor is removed; which latter situation is illustrated by FIG. 11G. In fact, the slopes of the inverter's output voltage are chosen in such manner as to result in this output voltage having a particularly low content of harmonic components, thereby minimizing potential problems associated with unwanted resonances of the output-series inductance with parasitic capacitances apt to be connected with ballast output terminals BOT1-/BOT2 by way of more-or-less ordinary wiring harness means used for connecting between these output terminals and the associated fluorescent lamps (FL1 and FL2).

With the preferred capacitance value of slow-down capacitor SDC, the inverter output voltage waveform will be as shown in FIGS. 11E, and the output voltage provided from secondary winding SW—under a condition of no load other than that resulting from a parasitic resonance involving a worst-value of parasitic output capacitance—will be as shown in FIG. 11F.

On the other hand, without having any slow-down capacitor, the inverter output voltage waveform will be as shown in FIG. 11G, and the output voltage provided from secondary winding SW—under a condition of no load other than that resulting from a parasitic resonance involving a worst-value of parasitic output capacitance—will be as shown in FIG. 11H. Under this condition, the power drawn by the inverter from its DC supply is more than 50 Watt; which power drain result from power dissipations within the inverter circuit and—if permitted to occur for more than a very short period—will cause the inverter to self-destruct.

On the other hand, the power drawn by the inverter under the same identical condition except for having modified the shape of the inverter's output voltage to be like that of FIG. 11E (instead of being like that of FIG. 11G) is only about −3 Watt; which amount of power drain is small enough not to pose any problem with respect to inverter self-destruction, nor even with respect to excessive power usage during extended periods where the inverter ballast is connected with its power source but without actually powering its fluorescent lamp load.

One difference between the circuit of FIG. 2 and that of FIG. 9 involves that fact that the FIG. 9 circuit uses field effect transistors. Never-the-less, the control of each transistor is effected by way of saturable current feedback transformers. However, instead of delivering its output current to a base-emitter junction, each current transformer now delivers its output current to a pair of series-connected opposed-polarity Zener diodes (as parallel-connected with a damping resistor and the gate-source input capacitance). The resulting difference in each transistor's control voltage is seen by comparing the waveform of FIG. 3B with that of FIG. 11B. In either case, however, the transistor is not switched into its ON-state until after the absolute magnitude of the voltage across its switched terminals (i.e. the source-drain terminals for a FET) has substantially diminished to zero.

In further contrast with the arrangement of FIG. 2, the inverter circuit of FIG. 9 is not loaded by way of a series-tuned L-C circuit. Instead, it is in fact loaded with a parallel-tuned L-C circuit; which parallel-tuned L-C circuit consists of the slow-down capacitor SDC as parallel-connected with the input-shunt inductance of primary winding PW. Yet, in complete contrast with other inverters loaded with parallel-tuned L-C circuits, the inverter of FIG. 9 is powered from a voltage source providing a substantially fixed-magnitude (i.e. non-varying) DC voltage.

Also in complete contrast with other inverters loaded with parallel-tuned L-C circuits, the inverter circuit of FIG. 9 provides for clamping (or clipping or truncating) of the naturally sinusoidal resonance voltage that would otherwise (i.e. in the absence of clamping) develop across the parallel-tuned L-C circuit; which naturally sinusoidal resonance voltage is illustrated by the dashed waveform of FIG. 11E.

In the FIG. 9 circuit, the indicated voltage clamping (or clipping or truncating) is accomplished by way of the commutating (or shunting) diodes built into each of the field effect switching transistors. In the FIG. 2 circuit, this clamping is accomplished by shunting diodes 66 and 67.

As previously indicated, to minimize the spurious and potentially damaging resonances which might occur due to an unknown parasitic capacitance becoming connected with ballast output terminals BOT1 and BOT2, it is important to minimize the harmonic content of the inverter's output voltage (which harmonic content—for a symmetrical inverter waveform—consists of all the odd harmonics in proportionally diminishing magnitudes). To attain such harmonic minimization, it is important that the inverter's output voltage be made to match or fit as nearly as possible the waveform of a sinusoidal voltage; which "best fit" occurs when the duration of the up/down-slopes equals about 25% of the total cycle period; which, as can readily be seen by direct visual inspection, corresponds closely to the waveforms actually depicted by FIGS. 3A, 11A and 11E.

However, substantial beneficial effects actually results even if the total duration of the up/down slopes were to be less than 25% of the total duration of the inverter output voltage period. In fact, substantial beneficial effects are attained with up-down slopes constituting as little as 10% of the total cycle period.

CONSTRUCTION OF BALLAST CIRCUIT FOR PREFERRED EMBODIMENT

Figures 12, 13:
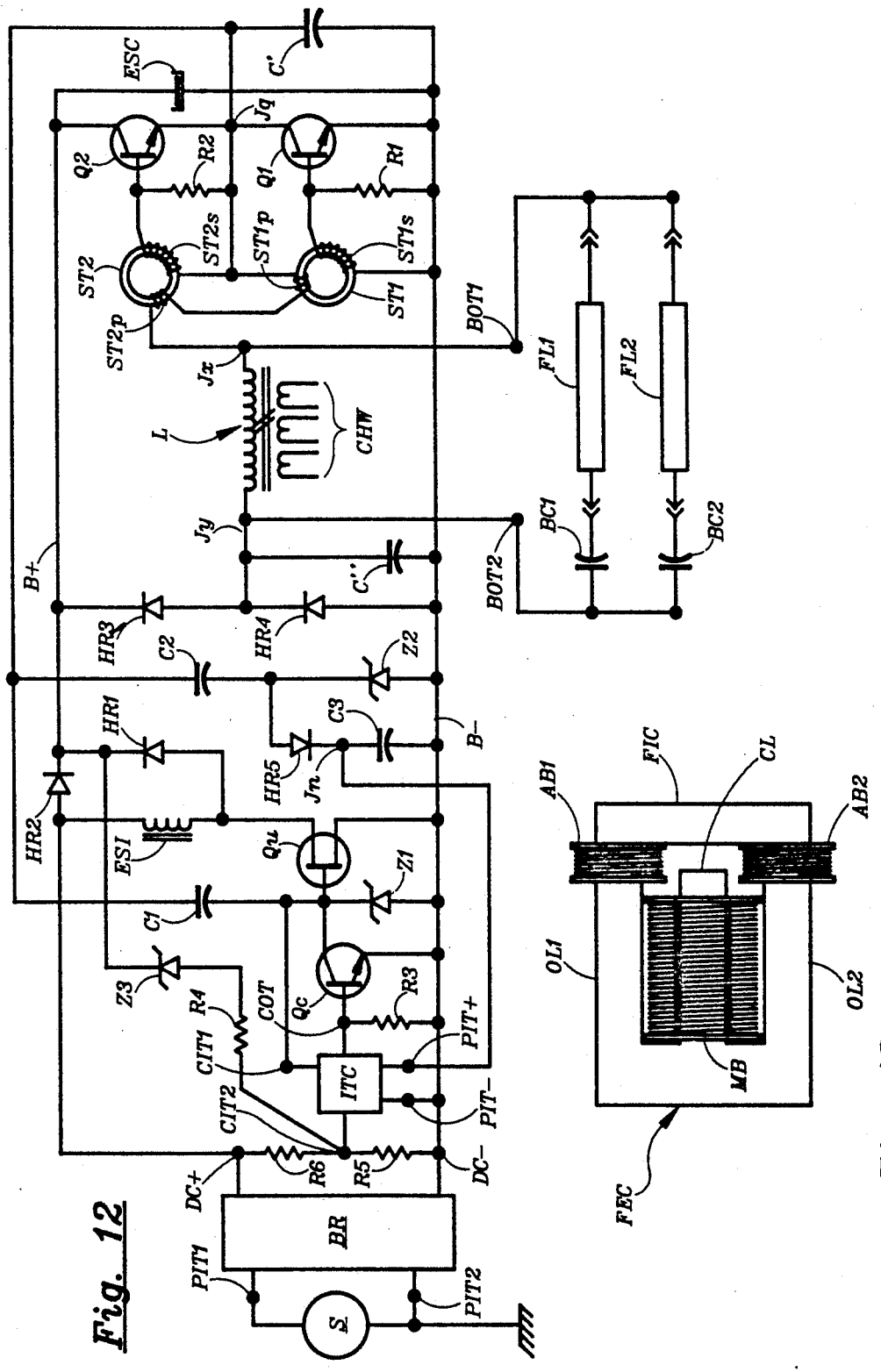
FIG. 12 is a schematic diagram illustrating a ballast circuit used for implementing the preferred embodiment of the present invention.
FIG. 13 is a schematic illustration of a combination tank inductor and cathode heater transformer used in the ballast circuit of FIG. 12.

In FIG. 12, which represents the preferred embodiment of the invention, a source S of 120 Volt/60 Hz voltage is applied to power input terminals P1T1 and P1T2 of a full-wave bridge rectifier BR, the unidirectional voltage output of which is provided between DC output terminals DC− and DC+. The DC−terminal is connected with a B−bus.

A field-effect transistor Qu is connected with its source terminal to the B−bus and with its drain terminal to the anode of a high-speed rectifier HR1, whose cathode is connected with a B+bus. Another high-speed rectifier HR2 is connected with its anode to the DC+terminal and with its cathode to the B+bus. An energy-storing inductor ESI is connected between the DC+terminal and the drain terminal of transistor Qu; and an energy-storing capacitor ESC is connected between the B−bus and the B+bus.

Between the B+bus and the B−bus are also connected a series-combination of two transistors Q1 and Q2; the emitter of transistor Q1 being connected with the B−bus; the collector of transistor Q2 being connected with the B+bus; and the collector of transistor Q1 and the emitter of transistor Q2 are both connected with a junction Jq.

A saturable current transformer ST1 has a secondary winding ST1s connected between the base and the emitter of transistor Q1; and a saturable current transformer ST2 has a secondary winding ST2s connected between the base and the emitter of transistor Q2. A resistor R1 is also connected between the base and the emitter of transistor Q1; and a resistor R2 is connected between the base and the emitter of transistor Q2.

Saturable transformer ST1 has a primary winding ST1p, and saturable transformer ST2 has a primary winding ST2p; which two primary windings are series-connected between junction Jq and a junction Jx.

A first tank capacitor C′ is connected between junction Jq and the B−bus. A tank inductor L is connected between junction Jx and a junction Jy; and a second tank capacitor C″ is connected between junction Jy and the B−bus.

Junction Jy is connected with the anode of a high-speed rectifier HR3, whose cathode is connected with the B+bus. A high-speed rectifier HR4 is connected with its cathode to the anode of rectifier HR3 and with its anode to the B−bus.

Junction Jx is connected with ballast output terminals BOT1; and junction Jy is connected with ballast output terminal BOT2.

A first fluorescent lamp FL1 is disconnectably connected in series with a first ballast capacitor BC1 to form a first series-combination; which first series-combination is connected between ballast output terminals BOT1 and BOT2. Similarly, a second fluorescent lamp FL2 is disconnectably connected in series with a second ballast capacitor BC2 to form a second series-combination; which second series-combination is also connected between ballast output terminals BOT1 and BOT2.

A capacitor C1 is connected between junction Jq and the gate terminal of transistor Qu; and a Zener diode Z1 is connected with its cathode to the gate terminal of transistor Qu and with its anode to the B−bus.

A capacitor C2 is connected between junction Jq and the cathode of a Zener diode Z2, whose anode is connected with the B−bus. A high-speed rectifier HR5 is connected with its anode to the cathode of Zener diode Z2 and with its cathode to a junction Jn. A capacitor C3 is connected between junction Jn and the B−bus.

A control transistor Qc is connected with its collector to the gate terminal of field effect transistor Qu and with its emitter to the B−bus. A resistor R3 is connected between the base of transistor Qc and the B−bus. An interval timer circuit ITC (such as an RC-type timer based on a so-called programmable unijunction transistor or PUT) has: (i) a positive DC power input terminal PIT+ connected with junction Jn; (ii) a negative DC power input terminal PIT− connected with the B−bus; (iii) a first control input terminal CIT1 connected with the gate terminal of transistor Qu; (iv) a second control input terminal CIT2; and (v) a control output terminal COT connected with the base of transistor Qc.

A Zener diode Z3 is connected with its cathode to the B+bus; a resistor R4 is connected between signal input terminal SIT and the anode of Zener diode Z3; a resistor R5 is connected between second control input terminal CIT2 and the B−bus; and a resistor R6 is connected between the DC+terminal and second control input terminal CIT2.

A set of cathode heater windings CHW are wound on tank inductor L; which cathode heater windings are connected with the thermionic cathodes of fluorescent lamps FL1 and FL2.

FIG. 13 provides certain details of tank inductor L and its associated cathode heater windings CHW.

Tank inductor L is wound on a main bobbin MB, which is positioned on the center leg CL of a ferrite E-core FEC, which is combined with an matching ferrite I-core FIC. Two of the cathode heater windings (the two which each powers a single thermionic cathode) are wound on a first auxiliary bobbin AB1, which is placed on one of the outer legs OL1 of ferrite E-core FC; and the remaining cathode heater winding (the one that powers two thermionic cathodes) is wound on a second auxiliary bobbin AB2, which is placed on the other outer leg OL2 of the ferrite E-core.

EXPLANATION OF WAVEFORMS OF FIG. 14

With reference to the circuit diagram of FIG. 12, the various waveforms of FIG. 14 may be explained as follows.

Waveform (a) represents the 120 Volt/60 Hz power line voltage present across power input terminals PIT1-/PIT2.

Waveform (b) represents the current flowing from the power line and into power input terminals PIT1-/PIT2.

Waveform (c) represents the alternating voltage present at junction Jq, which is substantially the same as that present at junction Jx, prior to lamp ignition.

Waveform (d) represents the alternating voltage present at junction Jy prior to lamp ignition.

Waveform (e) represents the voltage present between junctions Jx and Jy, which is the same as the voltage present between ballast output terminals BOT1 and BOT2, prior to lamp ignition.

Waveform (f) represent the current flowing through tank inductor L.

Waveform (g) represent the waveform of the voltage present at the base of transistor Q1.

Waveform (h) represents the alternating voltage present at junction Jq, which is substantially the same as that present at junction Jx, after lamp ignition.

Waveform (i) represents the alternating voltage present at junction Jy after lamp ignition.

Waveform (j) represents the voltage present between junction Jx and Jy, which is the same voltage as is present between ballast output terminals BOT1 and BOT2, after lamp ignition.

Waveform (k) represents the current flowing through one of the fluorescent lamps in response to the voltage represented by waveform (j).

Waveform (1) represent the current flowing through tank inductor L after lamp ignition.

DETAILS OF OPERATION OF THE CIRCUIT OF FIG. 12

The unfiltered full-wave-rectified power line voltage present between the DC−terminal and the DC+terminal has an instantaneous absolute magnitude that is substantially equal to that of the 120 Volt/60 Hz power line voltage impressed between power input terminals PIT1 and PIT2. Thus, within a few milliseconds of application of this power line voltage, energy-storing capacitor ESC will be charged-up to the peak magnitude (i.e., about 160 Volt) of the power line voltage.

Self-sustaining inverter operation is then initiated by providing a brief current pulse to the base of transistor Q1. (While this can be done manually, in an actual ballast the triggering will be done automatically by way of a simple trigger means consisting of a resistor, a capacitor and a Diac.)

Figure 14:
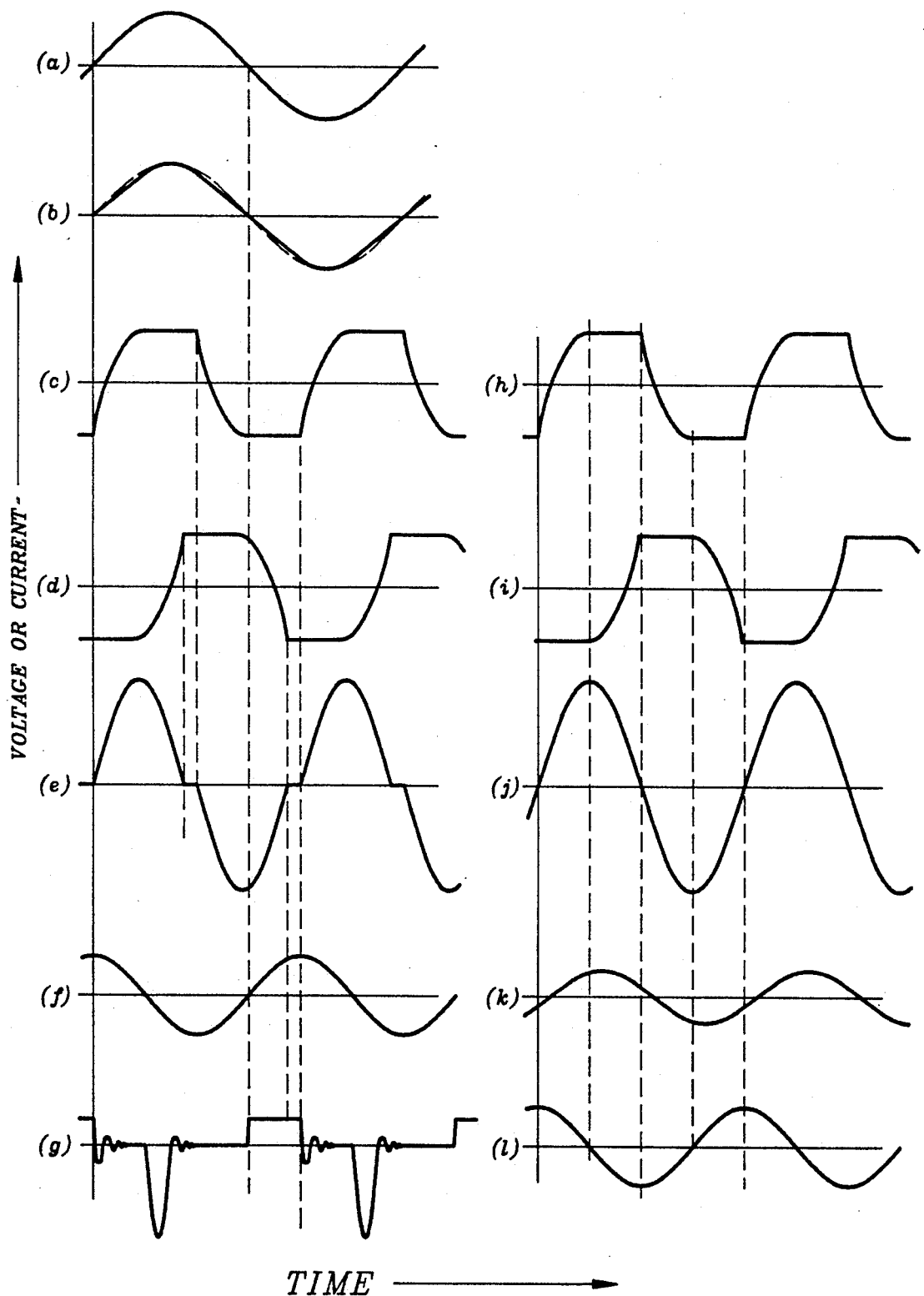
FIG. 14 shows various voltage and current waveforms associated with the circuit arrangement of FIG. 12.

Once triggered, the inverter (which consists of principal components ESC, Q1, Q2, ST1, ST2, L, C', C'', HR3 and HR4) will enter into a mode of stable self-oscillation as a result of the positive current feedback provided via saturable transformers ST1 and ST2; and will provide a 33 kHz (actually: a frequency in the range between 30 and 40 kHz) alternating voltage at junction Jq; the waveform of which alternating voltage will be as illustrated by waveforms (c) and (h) of FIG. 14.

The inverter's output voltage is coupled to the gate of field-effect transistor Qu by way of capacitor C1, thereby causing a positive gate voltage to develop thereat each time the inverter's output voltage increases in magnitude. More specifically, as the instantaneous magnitude of the voltage at junction Jq starts to rise (i.e., starts going toward a positive potential), a pulse of positive current flows through capacitor C1 and into the gate of Qu, thereby causing the voltage at the gate to increase rapidly to the point where Zener diode Z1 starts to conduct in its Zenering mode. That is, by action of Zener diode Z1, the voltage on the gate is prevented from attaining a positive voltage higher than about 15 Volt. Once having increased to 15 Volt positive, however, the gate voltage will remain substantially at that level until either: (i) a reverse current is provided through capacitor C1, or (ii) control transistor Qc is switched ON. Such a reverse current will indeed be provided as soon as the instantaneous magnitude of the voltage at junction Jq starts to fall (i.e., starts going toward a negative potential); which will occur about 15 micro-seconds after it started to rise. (It is noted, however, that the gate voltage is prevented from going more than about 0.7 Volt negative due to the plain rectifier action of Zener diode Z1.)

In other words, a 33 kHz substantially squarewave-shaped alternating voltage is provided at the gate of transistor Qu, thereby—at a 33 kHz rate—causing this transistor to switch ON and OFF with an ON-duty-cycle that is limited to a maximum of 50%. Thus, during each positive-voltage segment of the squarewave-like gate voltage, energy-storing inductor ESI gets connected across terminals DC− and DC+, thereby to be charged-up from the voltage present therebetween. Then, during each zero-voltage (or negative-voltage) segment of the squarewave-like gate voltage, the energy having been stored-up in inductor ESI during the previous half-cycle gets deposited on energy-storing capacitor ESC via rectifier HR1.

If transistor Qu were to be switched ON and OFF at a constant frequency (i.e., 33 kHz) and at a constant duty-cycle (e.g., 50%), the magnitude of the current drawn from the DC+terminal would increase more than proportionally with the magnitude of the DC voltage provided thereat; which would result in the instantaneous magnitude of the current drawn from the power line not being proportional to the instantaneous magnitude of the power line voltage; which, in turn, would result in a lower-than-desired power factor as well well as a higher-than-desired amount of harmonics.

Without any input provided to its second control input terminal CIT2, the interval timer circuit (ITC) operates in such manner as to cause control transistor Qc automatically to switch ON about 12 micro-seconds each time after the field effect transistor Qu has been switched ON. Thus, absent a control voltage at second control input terminal CIT2, field effect transistor Qu is switched ON for a duration of about 12 micro-seconds once every 30 micro-seconds (i.e., at a rate of 33 kHz).

However, this duration of 12 micro-seconds is caused to decrease as a monotonic function of the magnitude of the voltage provided at second control input terminal CIT2; and, since the magnitude of the voltage provided at this second control input terminal CIT2 is made to increase with increasing magnitude of the DC+voltage (as provided via resistor R6), the duration of the ON-time of the field effect transistor Qu will decrease with increasing magnitude of the DC+voltage. As an overall result, the waveshape of the current drawn from the power line will be improved, thereby providing for a power factor of about 99% and a total harmonic distortion of well under 10%.

A key aspect of the circuit of FIG. 12 relates to the shape of the waveform of the alternating voltage provided at the inverter's output (e.i., at junction Jq); which waveform is shown by waveforms (c) and (h) in FIG. 14 and may be described as a first quarter segment consisting of the initial 90° degrees of a sinusoidally rising voltage, followed by a second quarter segment consisting of a substantially constant-magnitude positive voltage, followed by a third quarter segment consisting of the initial 90° degrees of a sinusoidally falling voltage, followed by a fourth quarter segment consisting of a substantially constant-magnitude negative voltage.

This particular waveshape is attained in part by making the tank inductor have a natural resonance frequency with tank capacitor C′ that is substantially equal to the inverter's fundamental operating frequency.

However, the shape of the waveform of the alternating voltage provided at junction Jy is equally important to the proper functioning of the preferred embodiment; which waveshape is illustrated by waveforms (d) and (i) of FIG. 14, and may be described in a manner similar to that of the waveform of the alternating voltage provided at junction Jq.

The particular waveshape of the alternating voltage present at junction Jy is attained in part by making the tank inductor have a natural resonance frequency with tank capacitor C″ that is substantially equal to that of the inverter's fundamental operating frequency. Thus, the capacitance of tank capacitor C′ should be about equal to that of tank capacitor C″.

Moreover, the ON-time of each of the inverter's two switching transistors (Q1 and Q2) should be equal to one quarter of the duration of a complete period of the natural resonance frequency of the tank inductor and either one of the two tank capacitors (C′ and C″).

The voltage existing between junctions Jq (or Jx) and junction Jy will be perfectly sinusoidal when all the conditions spelled-out above are in effect. However, prior to lamp ignition, the waveform is sinusoidal except for brief intervals between each half-cycle; during which intervals the magnitude is zero. Yet, after lamp ignition, the waveform is indeed sinusoidal.

The reason for the difference in the waveforms before and after lamp ignition relates mainly to the effect of loading the L-C′/C″ tuned circuit; which loading causes the natural resonance period to change slightly from the unloaded condition.

As can be seen from waveform (k) of FIG. 14, the crest factor of the resulting lamp current is about 1.4, which is considered excellent.

It should be noted that, under the condition of perfect timing and tuning—as represented by waveform (j) of FIG. 14—only one of the tank capacitors is acting as tank capacitor at any one time. In fact, they alternate with quarter cycle intervals.

The peak magnitude of the ballast output voltage—i.e., the voltage provided between junctions Jx and Jy—is exactly equal to the magnitude of the DC supply voltage provided between the B−bus and the B+bus. A typical preferred magnitude for the DC supply voltage is about 350 Volt; which magnitude can—by way of simple control of the up-converter function (as provided by field-effect transistor Qu in combination with its associated timing circuit)—briefly be increased to about 450 Volt to facilitate the lamp ignition process.

The magnitude of the DC supply voltage is regulated by way of interval timer circuit ITC to be about 350 Volt. This regulation is accomplished with the help of Zener diode Z3, which has a Zenering voltage slightly below 350 Volt. Thus, as soon as the magnitude of the DC supply voltage tends to increase beyond 350 Volt, current starts flowing through resistor R4, thereby: (i) starting to increase the magnitude of the voltage applied to the second control input terminal CIT2, (ii) in turn, starting to shorten the duration of the ON-time of field effect transistor Qu, and (iii) in further turn, to reduce the amount of energy pumped up to the B+bus per operating cycle of the up-converter.

The 33 kHz voltage provided between the ballast output terminals BOT1 and BOT2 is balanced with respect to ground; which means that electric shock hazard problems are automatically mitigated. In fact, in case of ordinary F40/T-12 fluorescent lamps, with reference to the so-called U.L. "pin test", safety from electric shock hazard is provided for without resorting to the usual isolation transformer or ground-fault interrupt means.

DETAILS OF CONSTRUCTION OF THE PREFERRED EMBODIMENTS

Figure 15:
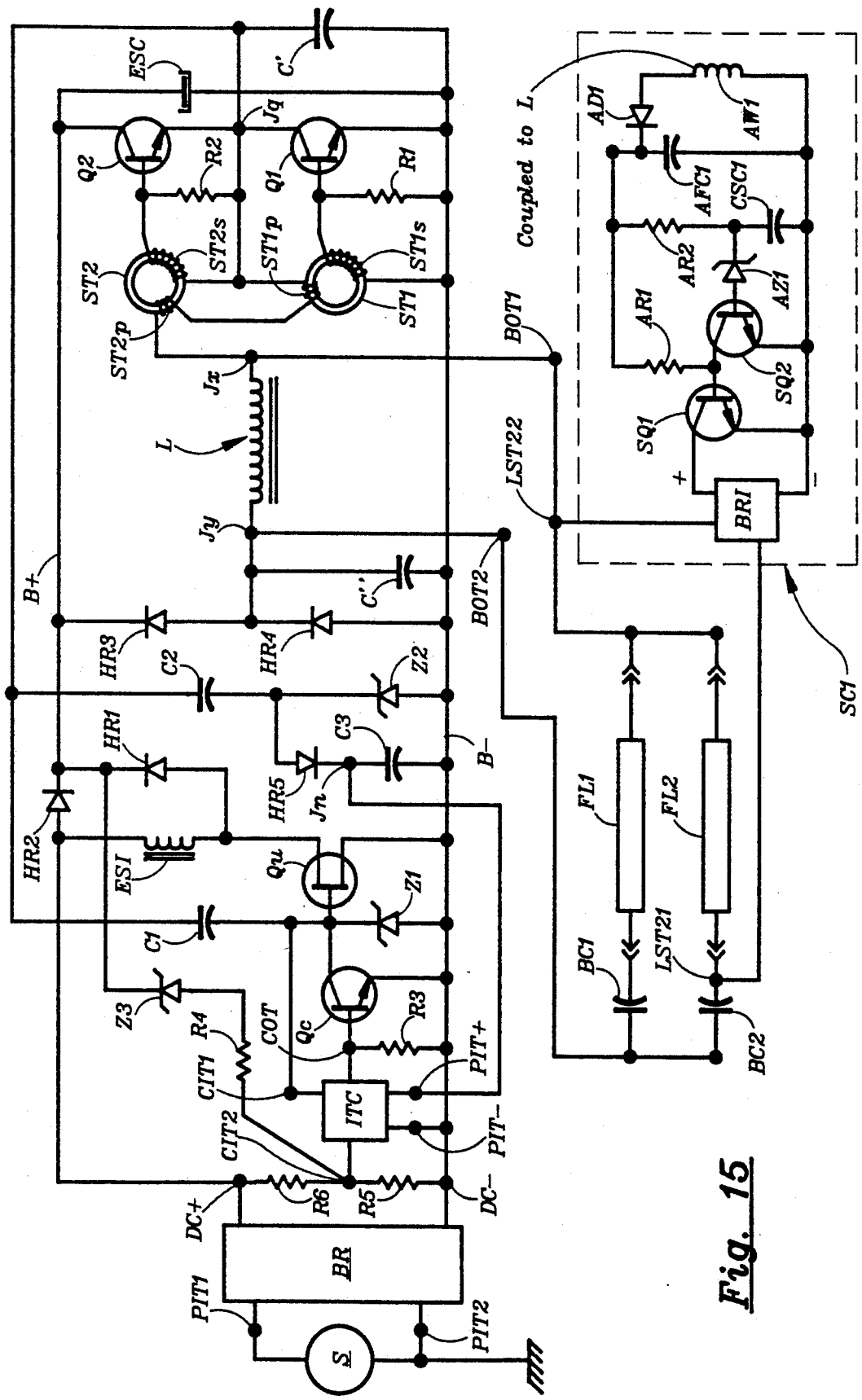
FIG. 15 is a schematic illustration of one version of the preferred embodiment of the invention.

The circuit of FIG. 15 is identical to that of FIG. 12, except that: (i) cathode heating windings CHW have been removed; (ii) a shorting circuit SC1 has been connected across lamp FL2, between lamp socket terminals LST21 and LST22; and (iii) to power SC1, an auxiliary winding AW1 has been added to inductor L.

Shorting circuit SC1 includes a bridge rectifier BR1, which has its AC input terminals connected with lamp socket terminals LST21 and LST22. The positive output terminal of bridge rectifier BR1 is connected with the collector of a shorting transistor SQ1; and the negative output terminal of bridge rectifier BR1 is connected with the emitter of shorting transistor SQ1.

One of the terminals of auxiliary winding AW1 is connected with the emitter of SQ1; the other output terminal o auxiliary winding AW1 is connected with the anode of a diode AD1. A filter capacitor AFC1 is connected between the cathode of diode AD1 and the emitter of transistor SQ1. A resistor AR1 is connected between the cathode of diode AD1 and the base of transistor SQ1; which base is also connected with the collector of a second shorting transistor SQ2, whose emitter is connected with the emitter of transistor SQ1. Another resistor AR2 is connected from the cathode of diode AD1 and the cathode of Zener diode AZ1, whose anode is connected with the base of transistor AQ1. A charge-storing capacitor CSC1 is connected between the cathode of Zener diode AZ1 and the emitter of transistor AQ1.

Figure 16:
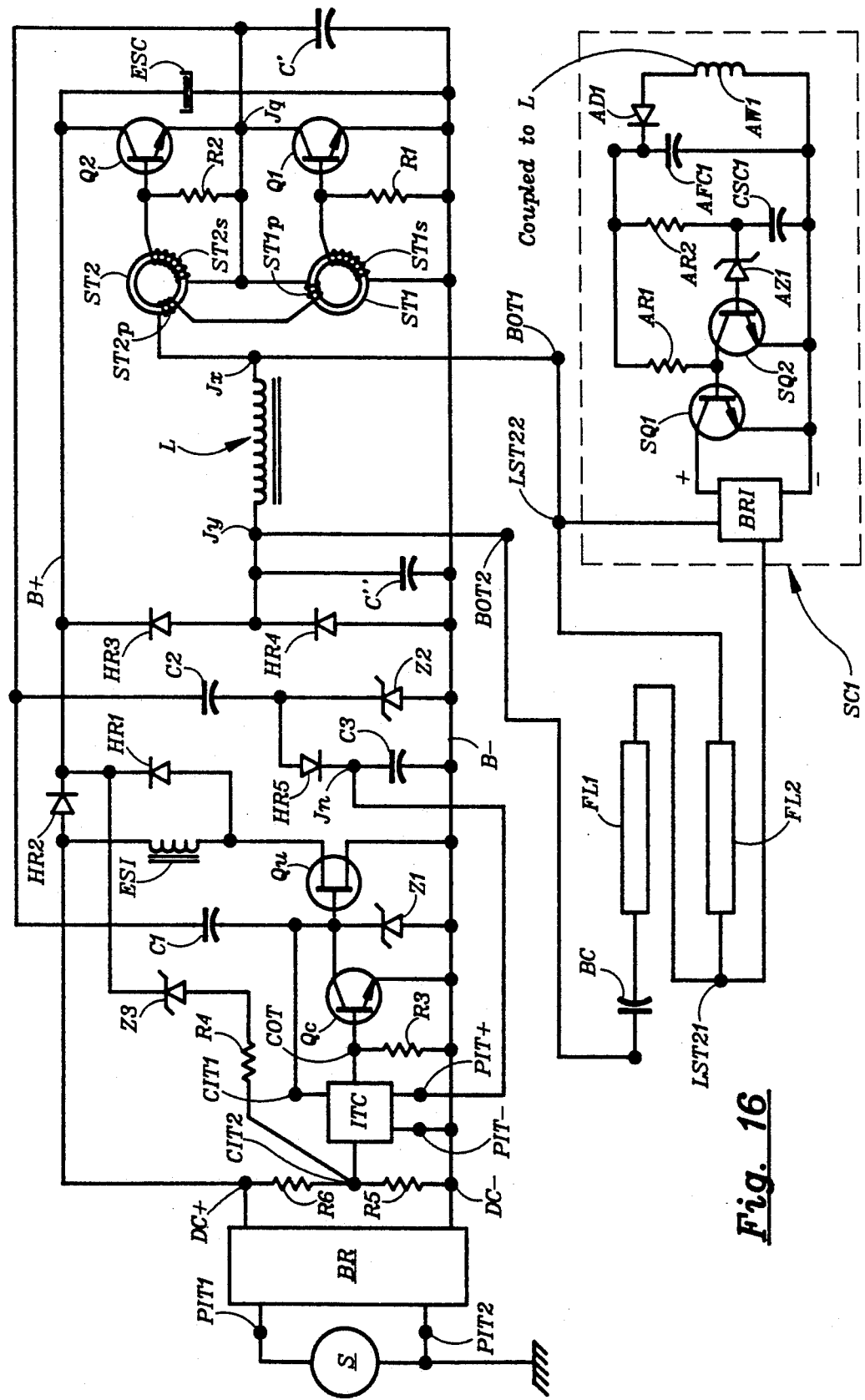
FIG. 16 is a schematic illustration of another version of the preferred embodiment.

The circuit of FIG. 16 is identical to that of FIG. 12, except that: (i) cathode heating windings CHW have been removed; (ii) ballast capacitors BC1, BC2 have been removed; (iii) a series-combination of a ballast capacitor BC and fluorescent lamps FL1 and FL2 has been connected between ballast output terminals BOT1 and BOT2; (iv) shorting circuit SC1 has been connected across lamp FL2, between lamp socket terminals LST21 and LST22; and (v) to power SC1, auxiliary winding AW1 has been added to inductor L.

Figure 17:
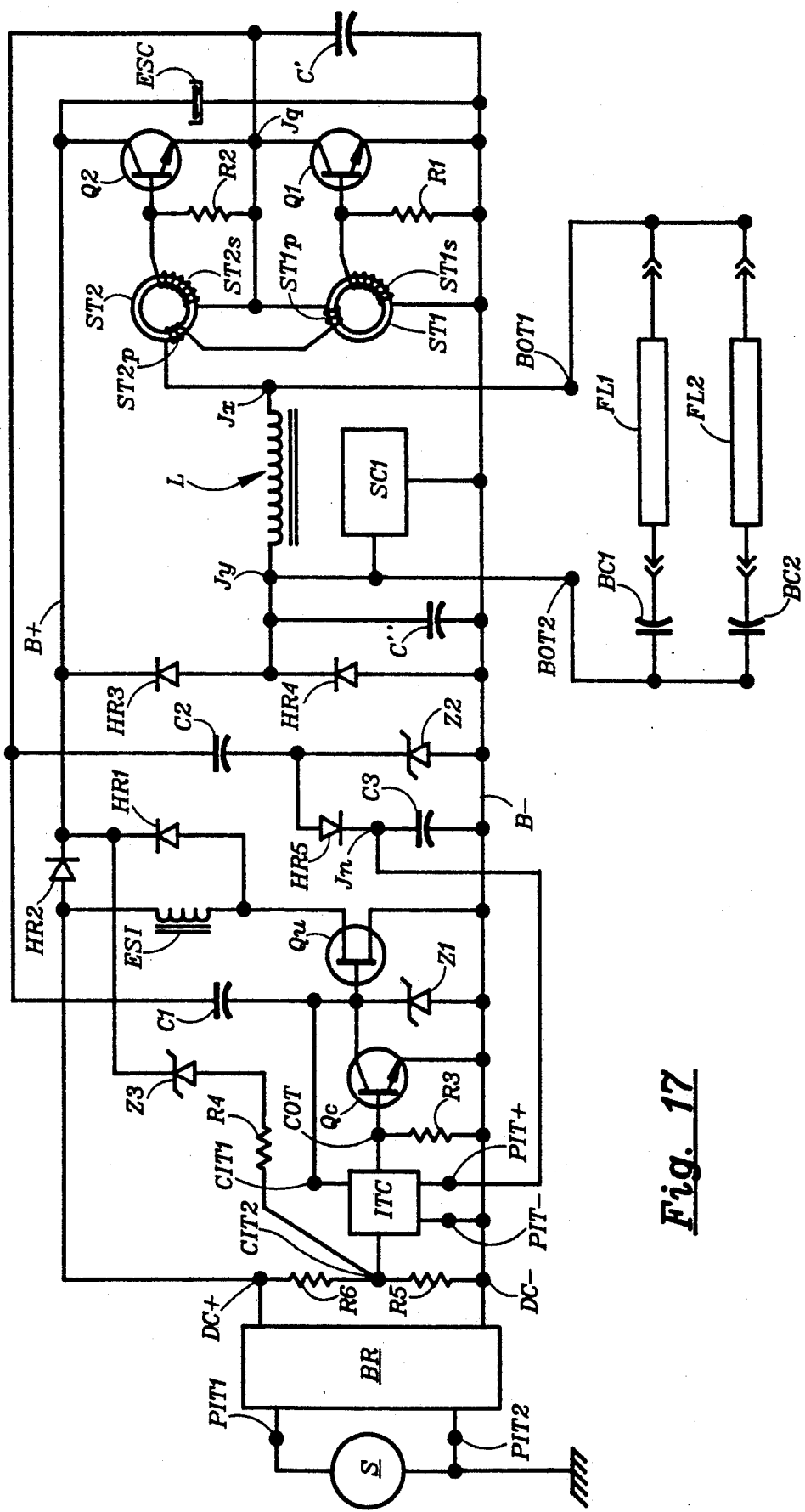
FIG. 17 is a schematic diagram of an alternative preferred embodiment if the invention.

The circuit of FIG. 17 is identical to that of FIG. 12, except that: (i) cathode heating windings CHW have been removed; (ii) shorting circuit SC1 has been connected between junction Jy and the B−bus; and (iii) to power SC1, auxiliary winding AW1 has been added to inductor L.

Figure 18:
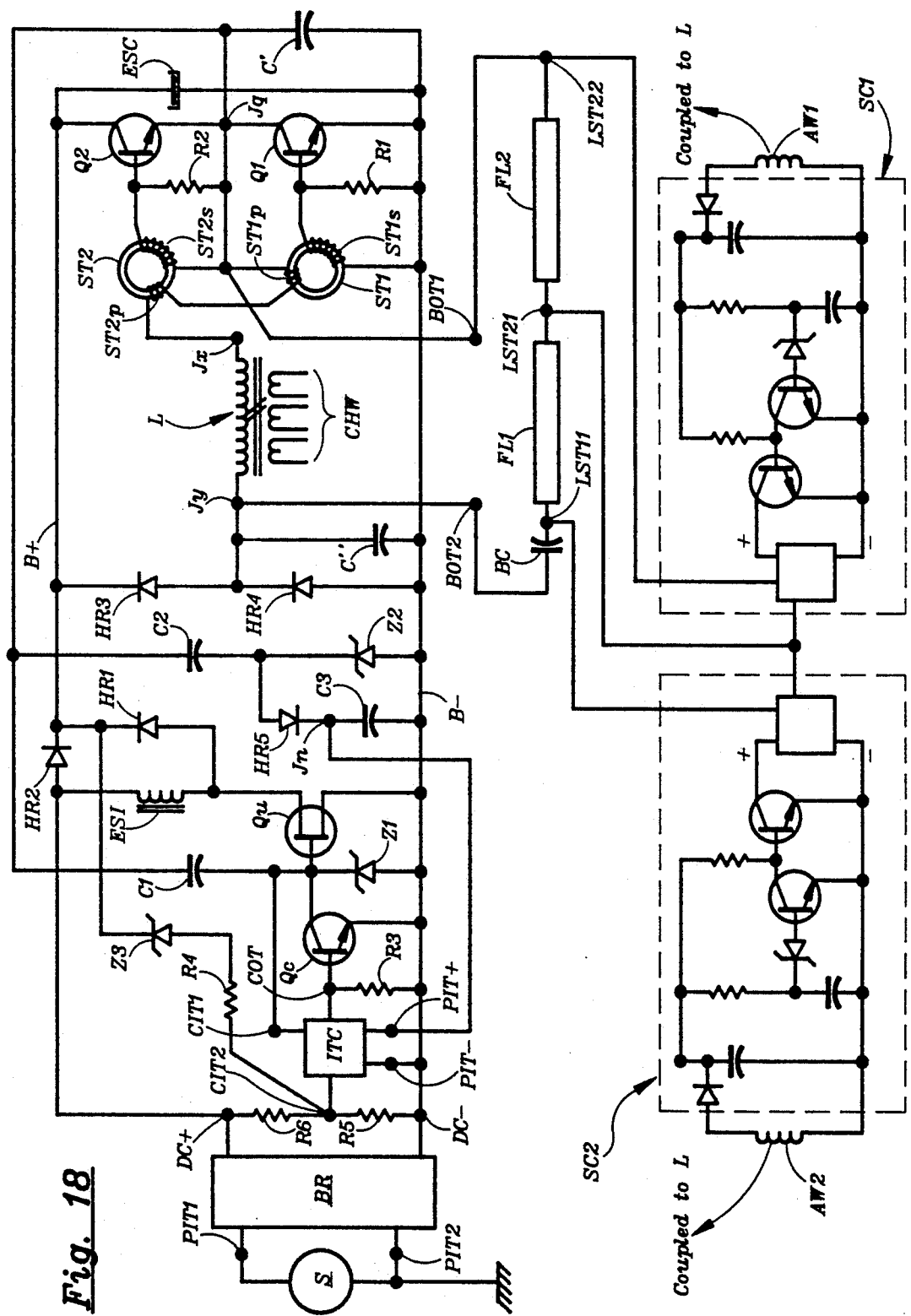
FIG. 18 is a schematic diagram of yet another version of the preferred embodiment.

The circuit of FIG. 18 is identical to that of FIG. 12, except that: (i) ballast output terminal BOT1 has been disconnected from junction Jx and has been connected instead with junction Jq; (ii) ballast capacitors BC1 and BC2 have been removed; (iii) a series-combination of ballast capacitor BC and fluorescent lamps FL1 and FL2 has been connected between ballast output terminals BOT1 and BOT2; (iv) shorting circuit SC1 has been connected across lamp FL2, between lamp socket terminals LST21 and LST22; (v) a shorting circuit SC2, which is structurally identical to SC1, has been connected across lamp FL1, between lamp socket terminals LST21 and LST11; and (vi) to power SC1 and SC2, respectively, auxiliary windings AW1 and AW2 have been added to inductor L.

DETAILS OF OPERATION OF THE PREFERRED EMBODIMENTS

The circuit of FIG. 15 operates in the same way as that of FIG. 12, except that: (i) no external cathode heating power is provided to fluorescent lamps FL1 and FL2, which are therefore instant-started; and (ii) upon initial power-up of the ballast, shorting circuit SC1 provides for a short circuit across one of the fluorescent lamps (FL2) for a period of about 100 milli-seconds, whereafter the short circuit is removed.

Thus, lamp FL1 ignites first, and is provided with about 100 milli-seconds during which to establish stable operation before FL2 is permitted to ignite.

The operation of shorting circuit SC1 is explained as follows.

As soon as the inverter starts operation, high-frequency output voltage will be provided across tank inductor L; which means that a high-frequency voltage will also be provided across auxiliary winding AW1. The voltage across AW1 is rectified and filtered so as to provide a DC voltage of substantially constant magnitude across filter capacitor AFC1.

Via resistor AR1, this DC voltage delivers base current to switching transistor SQ1; which transistor therefore becomes conductive, thereby—via bridge rectifier BR1—presenting a short circuit across lamp socket terminals LST21 and LST22.

However, via resistor AR2, this DC voltage also starts charging capacitor CSC1; which, after about 100 milli-seconds, reaches a voltage of sufficient magnitude to overcome the Zener voltage of Zener diode AZ1 and therefore to cause base current to be supplied to the base of transistor SQ2.

As soon as transistor SQ2 receives base current, it becomes conductive and then acts to shunt away (i.e., remove) base current from transistor SQ1, thereby causing shorting circuit SC1 to cease providing a short circuit between terminals LST21 and LST22.

With respect to the arrangement of FIG. 15, as a net result, for the initial 100 milli-seconds, the up-converter (i.e., the circuit represented by main elements Qu, ESI, HR1) and the inverter circuit (i.e., the circuit represented by main elements Q1, Q2, L, C', C", HR3, HR4) has to deliver an amount of power sufficient to properly ignite just one fluorescent lamp, namely FL1; which amount of power is between two and three times as high as this lamp's normal operating power. That is, during the ignition process—which normally lasts between 10 and 100 milli-seconds—the power drain from the ballast output terminals (BOT1, BOT2) is between two and three times higher than it is during normal lamp operation.

Thus, only after lamp FL1 has become fully ignited is lamp FL2 connected; and only then does the ballast have to provide the ignition power for the second lamp FL2.

Thus by staggering or sequencing the ignition of the two lamps, the ballast will only have to provide a maximum of three to four times the normal lamp operating power, versus otherwise having to provide four to six times the normal lamp operating power.

The advantage of requiring a reduced level of peak power output from the ballast is that correspondingly reduced-size, reduced-weight and/or reduced-cost components may then be used.

The circuit of FIG. 16 operates in the same way as that of FIG. 12, except that: (i) no external cathode heating power is provided to fluorescent lamps FL1 and FL2, which are therefore instant-started; (ii) the two lamps (FL1, FL2) are series-connected and ballasted via a common ballast capacitor BC; and (iii) upon initial power-up of the ballast, shorting circuit SC1 provides for a short circuit across one of the lamps for a period of about 100 milli-seconds, whereafter the short circuit is removed.

Thus, lamp FL1 ignites first, and is provided with about 100 milli-seconds during which to establish stable operation before FL2 is permitted to ignite.

A basic difference between the circuit arrangement of FIG. 15 and that of FIG. 16 relates to the magnitude of the Volt-Ampere product required to properly ignite the lamps.

The Volt-Ampere product required of the arrangement of FIG. 15 is simply that of the magnitude of the lamp ignition voltage multiplied by twice the magnitude of the lamp operating current; which is to say that the open circuit voltage must at least be equal to the full lamp ignition voltage, while the load current is in fact equal to the sum of the load currents drawn by the two lamps.

In the arrangement of claim 16, on the other hand, the required Volt-Ampere product is substantially lower; which Volt-Ampere product is equal to the product of the magnitude of the open circuit voltage required to be provided at the ballast output terminals and the desired operating load current. In particular fact, the magnitude of the required open circuit voltage will be equal to the sum of the magnitude of one lamp's ignition voltage and one lamp's operating voltage; while the load current will be equal to the operating current of but one lamp.

By way of example, if the fluorescent lamps were to be 48" T-8 Sylvania Octron lamps, the minimum lamp ignition voltage would be 500 Volt RMS, the lamp operating voltage would be about 135 Volt RMS, the lamp voltage prevailing during the ignition process would be about 350 Volt RMS, the lamp operating current would be about 0.2 Ampere RMS, the lamp operating power would be about 27 Watt, and the lamp ignition power (as required for up to 100 milli-seconds) would be about 70 Watt. Thus, the minimum Volt-Ampere product required to be supplied from the ballast output terminals would be (500+135) Volt×0.2 Amp=127 Volt-Ampere; the power required to be delivered during ignition of the first-to-ignite lamp would be about 70 Watt; and the power required to be delivered during ignition of the second-to-ignite lamp would be about 97 Watt.

In case of the FIG. 15 arrangement, the minimum required Volt-Ampere product would be 200 Volt-Ampere, although the minimum required ignition power would still be only 97 Watt.

On the other hand, if lamp ignition were to be accomplished without using a shorting circuit such as SC1, the minimum required Volt-Ampere product would be 200 Volt-Ampere for both the FIG. 15 and the FIG. 16 arrangements; and the minimum required ignition power would be about 140 Watt.

In the arrangement of FIG. 17, the operation is quite different compared with those of the FIGS. 16/17 arrangements.

In particular, it was found that by adding a certain element to the circuit of FIG. 12, a substantially higher maximum output power and Volt-Ampere product could be supplied, although only for a brief period of time. The permanent addition of this element was non-feasible, however, due to significantly reduced operating efficacies.

More particularly, it was found that by adding a capacitor (i.e., Caux) in parallel with tank capacitor C", a significant boost in output power could be attained for at least 100 milliseconds. Thus, by placing shorting circuit SC1 across this capacitor and by arranging for this shorting circuit to become an open circuit within a time-span of about 100 milli-seconds, the fluorescent lamps could be instant-started more effectively than otherwise.

The arrangement of FIG. 18 represents a still different use of a shorting circuit such as SC1.

In particular, in the arrangement of FIG. 18, the cathodes are provided with external heating power from cathode heating windings CHW. Shorting circuits SC1 and SC2 are arranged to close on initial power-up and to remain closed for a period long enough for the lamps' cathodes to have become incandescent, thereafter to open sequentially. More particularly, SC1 opens after about 750 milli-seconds, and SC2 opens after about 800 milli-seconds.

The values associated with the arrangement of FIG. 18 are two-fold: (i) by being ignited after the cathodes have reached incandescence, lamp starting is accomplished in a particularly gentle manner, thereby resulting in extremely long lamp life; and (ii) by being sequentially ignited, the ballast's required Volt-Ampere product is substantially reduced compared with what it otherwise would have had to be.

ADDITIONAL EXPLANATIONS AND COMMENTS (a) With reference to FIGS. 2 and 5, adjustment of the amount of power supplied to load 26', and thereby the amount of light provided by lamp 71, may be accomplished by applying a voltage of adjustable magnitude to input terminals IP1 and IP2 of the Toroid Heater; which is thermally coupled with the toroidal ferrite cores of saturable transformers 47, 49.

(b) With commonly available components, inverter circuit 24 of FIG. 2 can be made to operate efficiently at any frequency between a few kHz to perhaps as high as 50 kHz. However, for various well-known reasons (i.e., eliminating audible noise, minimizing physical size, and maximizing efficiency), the frequency actually chosen is in the range of 20 to 40 kHz.

(c) The fluorescent lighting unit of FIG. 1 could be made in such manner as to permit fluorescent lamp 11 to be disconnectable from its base 12 and ballasting means 16. However, if powered with normal line voltage without its lamp load connected, frequency-converting power supply and ballasting circuit 16 is apt to self-destruct.

To avoid such self-destruction, arrangements can readily be made whereby the very act of removing the load automatically establishes a situation that prevents the possible destruction of the power supply and ballasting means. For instance, with the tank capacitor (52) being permanently connected with the lamp load (11)—thereby automatically being removed whenever the lamp is removed—the inverter circuit is protected from self-destruction.

(d) At frequencies above a few kHz, the load represented by a fluorescent lamp—once it is ignited—is substantially resistive. Thus, with the voltage across lamp 11 being of a substantially sinusoidal waveform (as indicated in FIG. 3d), the current through the lamp will also be substantially sinusoidal in waveshape.

(e) In the fluorescent lamp unit of FIG. 1, fluorescent lamp 11 is connected with power supply and ballasting circuit 16 in the exact same manner as is load 26 connected with the circuit of FIG. 2. That is, it is connected in parallel with the tank capacitor (52) of the L-C series-resonant circuit. As is conventional in instant-start fluorescent lamps—such as lamp 11 of FIG. 1—the two terminals from each cathode are shorted together, thereby to constitute a situation where each cathode effectively is represented by only a single terminal. However, it is not necessary that the two terminals from each cathode be shorted together; in which case—for instant-start operation—connection from a lamp's power supply and ballasting means need only be made with one of the terminals of each cathode.

(f) In FIG. 9, a Parasitic Capacitance is shown as being connected across terminals BOT1 and BOT2. The value of this parasitic capacitance may vary over a wide range, depending on unpredictable details of the particular usage situation at hand. Values for the parasitic capacitance will expectedly vary between 100 and 1000 pico-Farad—depending on the nature of the wiring harness used for connecting between the output of secondary winding SW and the plural terminals of lamps FL1/FL2.

(g) The worst case of parasitic oscillation associated with the circuit arrangement of FIG. 9 is apt to occur when the value of the parasitic capacitance (i.e., the capacitance of the ballast-to-lamp wiring harness) is such as to cause series-resonance with the output-series inductance of secondary winding SW at the third harmonic component of the inverter's output voltage. The next worst case of parasitic oscillation is apt to occur when the value of the parasitic capacitance is such as to series-resonate with the output-series inductance at the fifth harmonic component of the inverter's output voltage. With the typical value of 5.4 milli-Henry for the output-series inductance, it takes a total of about 600 pico-Farad to resonate at the third harmonic component of the inverter's 30 kHz output voltage; and it takes about 220 pico-Farad to resonate at the fifth harmonic component of the inverter's output voltage. These capacitance values are indeed of such magnitudes that they may be encountered in an actual usage situation of an electronic ballast. Moreover, at higher inverter frequencies, the magnitudes of the critical capacitance values become even lower.

(h) FIG. 10 shows cathode heater windings CHW placed on a bobbin separate from that of primary winding PW as well as separate from that of secondary winding SW. However, in many situations, it would be better to place the cathode heater windings directly onto the primary winding bobbin B1. In other situations it would be better to place the cathode heater windings directly onto the secondary winding bobbin B2.

If the cathode heater windings are wound on bobbin B1 (i.e. in tight coupling with the primary winding), the magnitude of the cathode heating voltage will remain constant regardless of whether or not the lamp is ignited; which effect is conducive to maximixing lamp life. On the other hand, if the cathode heater windings are wound on bobbin B2 (i.e. in tight coupling with the secondary winding), the magnitude of the cathode heating voltage will be high prior to lamp ignition and low after lamp ignition; which effect is conducive to high luminous efficacy.

By placing the cathode heater windings in a location between primary winding PW and secondary winding SW, it is possible to attain an optimization effect: a maximization of luminous efficacy combined with only a modest sacrifice in lamp life. That is, by adjusting the position of bobbin B3, a corresponding adjustment of the ratio of pre-ignition to post-ignition cathode heater voltage magnitude may be accomplished.

(i) For easier lamp starting, a starting aid capacitor may be used in shunt across one of the fluorescent lamps FL1/FL2.

Also, a starting aid electrode (or ground plane) may advantageously be placed adjacent the fluorescent lamps; which starting aid electrode should be electrically connected with the secondary winding, such as via a capacitor of low capacitance value.

(j) To control (reduce) the degree of magnetic coupling between primary winding PW and secondary winding SW, a magnetic shunt may be positioned across the legs of the E-cores—in a position between bobbins B1 and B3.

(k) Considering the waveforms of FIGS. 1A, 11A and 11E each to include 360 degrees for each full and complete cycle: (i) each half-cycle would include 180 degrees; (ii) each total up-slope would include almost or about 60 degrees degrees; (iii) each total down-slope would include almost or about 60 degrees; and (iv) each horizontal segment would include about 120 degrees or more. Yet, as previously indicated, substantial utility may be attained even if each complete up-slope and down-slope were to include as little 18 degrees.

(l) In the FIG. 9 circuit, the inverter's operating frequency is not ordinarily (or necessarily) equal to the natural resonance frequency of the parallel-tuned L-C circuit that consists of slow-down capacitor SDC and the input-shunt inductance of primary winding PW. Rather, the inverter's actual operating frequency is ordinarily lower than would be this natural resonance frequency.

(m) With reference to FIG. 11I, in a trapezoidal waveform that constitutes a best fit for a sinusoidal waveform, the peak magnitude is lower than that of the sinusoidal waveform, and the up-slope and down-slope are each steeper that the corresponding slopes of the sinusoidal waveform.

(n) The FIG. 9 inverter arrangement has to be triggered into self-oscillation. A suitable automatic triggering means would include a resistor, a capacitor, and a so-called Diac. However, manual triggering may be accomplished by merely momentarily connecting a discharged capacitor (of relatively small capacitance value) between the gate of transistor FET1 and the B+bus.

(o) Most switching-type field effect transistors have built-in commutating (or shunting) diodes, as indicated in FIG. 9. However, if such were not to be the case, such diodes should be added externally, as indicated in the FIG. 2 circuit.

(p) In ordinary inverter circuits, the inverter output voltage is effectively a squarewave voltage with very steep up-slopes and down-slopes. In inverters using field effect transistors, the time required for the inverter's squarewave output voltage to change between its extreme negative potential to its extreme positive potential is usually on the order of 100 nano-seconds or less. In inverters using bi-polar transistors, this time is usually on the order of 500 nanoseconds or less. In the inverter of the FIG. 9 circuit, however, this time has been extended—by way of the large-capacitance-value slow-down capacitor SDC—to be on the order of several micro-seconds, thereby achieving a substantial reduction of the magnitudes of the harmonic components of the inverter's (now trapezoidal) output voltage.

(q) In an actual prototype of the FIG. 9 ballast circuit—which prototype was designed to properly power two 48 inch 40 Watt T-12 fluorescent lamps—the following approximate parameters and operating results prevailed:

1. operating frequency: about 30 kHz;
2. slow-down capacitor: 0.02 micro-Farad;
3. shunt-input inductance: 1.4 milli-Henry;
4. up-slope duration: about 4 micro-seconds;
5. down-slope duration: about 4 micro-seconds;
6. series-output inductance: 5.4 milli-Henry;
7. parasitic capacitance across BOT1/BOT2 terminals; 800 pico-Farad;
8. power consumption when unloaded: about 4 Watt;
9. power consumption when loaded with two F40/T12 fluorescent lamps: about 70 Watt;
10. power consumption when unloaded but with slow-down capacitor removed: about 80 Watt.

It is be noted that the natural resonance frequency of the L-C circuit consisting of a slow-down capacitor of 0.02 micro-Farad as parallel-combined with a shunt-input inductance of about 1.4 milli-Henry is about 30 kHz. This means that—as far as the fundamental component of the 30 kHz inverter output voltage is concerned—the parallel-tuned L-C circuit represents a very high impedance, thereby constituting no substantive loading on the inverter's output.

(r) Of course, the FIG. 9 ballast circuit can be made in the form of a push-pull circuit such as illustrated by FIG. 7; in which case center-tapped transformer 96 would be modified in the sense of being made as a leakage transformer in full correspondence with leakage transformer LT of FIG. 9. Also, of course, inductor 119, capacitor 118, and load 121 would be removed. Instead, the load would be placed at the output of the secondary winding of the modified center-tapped transformer 96; which would be made such as to have appropriate values of input-shunt inductance and output-series inductance. Capacitor 117 would constitute the slow-down capacitor.

(s) The auxiliary DC supply voltage required for proper operation of interval timer circuit ITC is obtained by way of capacitor C2 from the inverter's squarewave output voltage. The magnitude of this auxiliary DC supply voltage (about 10 Volt) is determined by the Zenering voltage of Zener diode Z2. Filtering filtering of this DC voltage is accomplished via capacitor C3.

(t) To meet usual requirements with respect to EMI suppression, suitable filter means is included with bridge rectifier BR.

(u) Further details with respect to the operation of a half-bridge inverter is provided in U.S. Pat. No. 4,184,128 to Nilssen, particularly via FIG. 8 thereof.

(v) Power source S in FIG. 1 is shown as having one of its terminals connected with earth ground. In fact, it is standard practice that one of the power line conductors of an ordinary electric utility power line be electrically connected with earth ground.

(w) The B—bus of the ballast circuit of FIG. 2 is connected with one of the DC output terminals of bridge rectifier BR; which means that, at least intermittently, the B—bus is electrically connected with earth ground.

(x) The term "crest factor" pertains to a waveform and identifies the ratio between the peak magnitude of that waveform to the RMS magnitude of that waveform. Thus, in case of a sinusoidal waveform, the crest factor is about 1.4 in that the peak magnitude is 1.4 times as large as the RMS magnitude.

(y) In the arrangement of FIG. 12, if additional output voltage magnitude were to be desired, an auxiliary secondary winding may be added to tank inductor L. However, except if lamps were not going to be parallel-connected, this auxiliary winding should be tightly coupled with the tank inductor winding.

However, in case just a single fluorescent lamp (or two or more series-connected lamps) were to be used, this auxiliary secondary winding could advantageously be loosely coupled with the tank inductor winding, in which case its internal inductance could be used as the ballasting reactance.

(z) In an actual prototype of the FIG. 12 ballast circuit—which prototype was designed to properly power two 40 Watt T-12 fluorescent lamps—the following approximate parameters and operating results prevailed:

| | |
|---|---|
| 1. operating frequency: | 35 kHz; |
| 2. first tank capacitor C': | 0.022 micro-Farad; |
| 3. second tank capacitor C": | 0.022 micro-Farad; |
| 4. tank inductor L: | 0.9 milli-Henry; |
| 5. total up-slope duration: | 7.0 micro-seconds; |
| 6. total down-slope duration: | 7.0 micro-seconds; |
| 7. inverter transistor ON-time: | 7.0 micro-seconds; |
| 8. each ballast capacitor BC1/BC2: | 0.0056 micro-Farad; |
| 9. power consumption when unloaded: | less than 5.0 Watt; |
| 10. lamp current crest factor: | 1.3; |
| 11. magnitude of DC supply voltage: | 400 Volt; |
| 12. each fluorescent lamp: | F40/T-12; |
| 13. total power when fully loaded: | 75 Watt. |

(aa) With reference to FIG. 13, by balancing the cathode heater windings between the two outer legs of the ferrite E-core, short circuit protection is attained. If the cathode heater winding(s) on one of the legs were to be short-circuited, the magnetic flux in the core will simply automatically flow through the other leg and—although providing more cathode heating power to the cathodes connected to the windings on this other leg—will not give rise to any critical damage.

(ab) With reference to FIG. 10, it is noted that dimming of light output can be achieved by providing for an adjustable magnetic shunting means positioned between primary winding PW and secondary winding SW; which magnetic shunting means should provide for a shunting path for magnetic flux between the two outer legs and the center leg of the E-cores.

(ac) Careful analysis of the waveforms of FIG. 14 will reveal that—for a given magnitude of the DC supply voltage—the peak-to-peak magnitude of the AC voltage provided across ballast output terminals BOT1 and BOT2 will be ever so slightly lower before lamp ignition as compared with after lamp ignition. This effect is due to the slightly imperfect phasing between waveforms (c) and (d) versus that between waveforms (h) and (i); which imperfect phasing is evidenced by the brief zero-magnitude segments of waveform (e).

However, due to the normal effect of lamp loading, the magnitude of the DC supply voltage is apt to be somewhat higher prior to lamp ignition as compared with after lamp ignition; which latter effect will more than cancel the effect of phasing imperfection.

(ad) Although it is indicated that tank capacitor C' be of the same capacitance as that of tank capacitor C", such is by no means necessary. In fact, in some situations it is distinctly an advantage for one tank capacitor to have a larger capacitance than that of the other tank capacitor.

(ae) In FIG. 13, an alternative location for the cathode heater windings is on ferrite I-core FIC—with one set of windings on each side of the center leg of ferrite E-core FEC.

(af) With respect to the arrangements of FIGS. 15–18, it is clear that the basic principle associated with using a shorting circuit (such as SC1) across one or two lamps may readily be extended to more than two lamps.

For instance, with respect to the arrangement of FIG. 16, it would be particularly advantageous to use the principle for three or four series-connected lamps; in which case one of the shorting circuits should constitute a short circuit for about 100 milli-seconds, a second one should constitute a short circuit for about 200 milli-seconds, and a third one should constitute a short circuit for about 300 milli-seconds.

While a single ordinary 200 milli-Ampere Instant-Start fluorescent lamp requires 500 Volt for proper ignition, with sequencing, each additional series-connected lamp adds only about 135 Volt to the required ignition voltage. This implies that four such lamps can be properly ignited with a total available ignition voltage of slightly over 1000 Volt (i.e., about 250 Volt per lamp), a total available ignition power of about 150 Watt (i.e., about 37.5 Watt per lamp) versus 500 Volt per lamp and 70 Watt per lamp in case of single lamp operation.

(ag) With respect to the Rapid-Start ballasting arrangement of FIG. 18, it is noted that the significant benefit of delayed application of starting voltage may be accomplished by using but a single shorting circuit spanning both lamps.

(ah) While there is some advantage associated with staggering or sequencing the ignition of plural Rapid-Start fluorescent lamps, the advantage associated with staggered or sequenced lamp ignition is particularly great for Instant-Start lamps. The reason for this is the fact that the ratio between the magnitudes of the lamp ignition voltage and the lamp operating voltage is so much higher in case of Instant-Start lamps.

(ai) It is noted that, as is actually done in the arrangement of FIG. 18, ballast output terminal BOT1 may be connected to junction Jq rather than to junction Jx. When using self-oscillating inverters, this particular connection may at times be advantageous.

(aj) In the arrangement of FIG. 16, during normal operation, if one of the fluorescent lamps were to be removed, both lamps would extinguish. If then this one lamp were to be replaced, lamp ignition would not necessarily occur except if the ballast power source (S) were to be disconnected and then reconnected.

The reason for this is that, once the 100 milli-seconds delay has occurred, the shorting circuit becomes latched into an open circuit condition; and the only way of de-latching this circuit is to remove power to the ballast for a brief period.

If it be desired that removal and replacement of a lamp should be accomplishable without having to disconnect and re-connect the power to the ballast in order to get the lamps re-ignited, this may readily be accomplished. In particular, this can be accomplished by arranging the shorting circuit to automatically de-latch.

More particularly, with reference to FIG. 15, this de-latching may be accomplished by sensing the magnitude of the peak voltage at the collector of transistor SQ1, and if that peak voltage were to exceed a certain level for even a very brief time (e.g. less than one milli-second), charge storage capacitor CSC1 would be discharged; which would accomplish the desired de-latching.

Even more particularly, this de-latching may be accomplished by: (i) connecting the collector of an additional transistor to the cathode of Zener diode AZ1 (FIG. 15); (ii) connecting the emitter of this additional transistor to the emitters of transistors SQ1, SQ2; (iii) connecting the cathode of a second Zener diode to the collector of transistor SQ1; and (iv) connecting the anode of this second Zener diode to the base of the additional transistor.

The additional Zener diode (which might in fact have to be made up of several Zener diodes) should have a Zener voltage about equal to the peak voltage of the lamp ignition voltage; which means that—in the arrangement of FIG. 16—if lamp FL2 were to be removed, shorting circuit SC1 would cycle once every 100 milli-seconds: constituting a short circuit for a period of 100 milli-seconds and an open circuit for a period of about 1 milli-second or less.

Thus, not only would it then be possible to remove and replace lamp without having to follow a special procedure to re-ignite the replaced lamp, it would also be possible to remove one lamp and yet have the other lamp provide full light output even with the one lamp removed. In other words, by having an automatically delatching shorting circuit in parallel with each lamp, a ballast capable of powering, say, four series-connected lamps would be able to light any combination of these lamps; which is to say that if one or two or three lamps were to be removed (or fail to ignite), the remaining lamps would provide light output as if no lamps had been removed.

By making the shorting circuit cycle in such manner as to have an OFF-period of less than 1 milli-second, flicker effects will be quite modest. By making the OFF-period no longer than about 0.1 milli-second, flicker effects will be negligible.

(ak) It is thought that the present invention and many of its attendant advantages will be understood from the foregoing description and that many changes may be made in the form and construction of its components parts, the form described being merely a preferred embodiment of the invention.

I claim:

1. An arrangement comprising:

a source providing an output voltage across a pair of output terminals; the source having internal impedance functional to limit to a certain maximum magnitude the current that can be drawn from the output terminals;

a first and a second gas discharge lamp series-connected to form a lamp load connected across the output terminals; the lamp load being functional to draw current from the output terminals without at any time constituting a short circuit thereacross; the first gas discharge lamp having a pair of first lamp terminals; and circuit means connected across the pair of first lamp terminals; the circuit means being operative to constitute a short circuit for a brief period of time, whereafter it becomes an open circuit.

2. The arrangement of claim 1 wherein the gas discharge lamps include a fluorescent lamp.

3. The arrangement of claim 2 wherein the fluorescent lamp is an instant-start fluorescent lamp.

4. The arrangement of claim 1 wherein the duration of the brief period is from about 20 to about 200 milli-seconds.

5. The arrangement of claim 1 wherein, in the event the first gas discharge lamp were to fail to draw current, the circuit means cycles periodically between constituting a short circuit and constituting an open circuit.

6. The arrangement of claims 5 wherein the circuit means cycles with a cycle period from about 20 to about 200 milli-seconds; each cycle period including a short-circuit period during which the circuit means constitutes a short circuit and an open-circuit period during which the circuit means constitutes an open circuit.

7. The arrangement of claim 6 wherein the short-circuit period has a duration longer than that of the open-circuit period.

8. The arrangement of claim 7 wherein (i) the short-circuit period is in the range from about 20 to about 200 milli-seconds; and (ii) the open-circuit period is equal to or shorter than about 1 milli-second.

9. The arrangement of claim 1 wherein the voltage is an AC voltage of frequency substantially higher than that of the voltage on an ordinary electric utility power line.

10. The arrangement of claim 1 wherein the second gas discharge lamp is operative to provide substantially the same amount of light whether the first gas discharge lamp drawn current or not.

11. The arrangement of claim 1 wherein: (1) during normal operation, the first and the second gas discharge lamp is each operative to emit a certain amount of luminous flux; and (ii) in the event the first lamp were to fail to draw current, the second lamp would still emit at least said certain amount of luminous flux.

12. The arrangement of claim 1 wherein: (i) the second gas discharge lamp has a pair of second lamp terminals; and (ii) a second circuit means is connected across the pair of second lamp terminals, the second circuit means being operative to constitute a short circuit for a brief period of time, whereafter it becomes an open circuit.

13. The arrangement of claim 12 wherein: (i) during normal operation, the first and the second gas discharge lamp is each operative to emit a certain amount of luminous flux; and (ii) in the event that either of the two gas discharge lamps were to fail to draw current, the other gas discharge lamp would still emit at least said certain amount of luminous flux.

14. The arrangement of claim 12 wherein: (i) during normal operation, an output current of a certain magnitude is drawn from the output terminals; and (ii) in the event that both gas discharge lamps were to fail to draw current, an output current of magnitude approximately equal to said certain magnitude would still be drawn from the output terminals.

15. The arrangement of claim 12 wherein: (i) the first gas discharge lamp has a thermionic cathode and a pair of cathode terminals; and (ii) the source has a pair of cathode output terminals connected with the cathode terminals and operative to provide cathode heating power thereto.

16. The arrangement of claim 1 wherein the circuit means is characterized by including a transistor means operative to effectuate said short circuit.

17. The arrangement of claim 1 wherein the voltage is an AC voltage and the circuit means is characterized by including: (i) rectifier means; (ii) transistor means; and (iii) voltage threshold means.

18. The arrangement of claim 17 wherein the voltage threshold means includes a Zener diode.

19. The arrangement of claim 1 wherein the circuit means is characterized by including an R-C timing circuit.

20. The arrangement of claim 1 wherein: (i) the source includes a pair of auxiliary output terminals operative to provide an auxiliary output voltage; and (ii) the circuit means includes a pair of power input terminals connected with the auxiliary output terminals.

21. The arrangement of claim 1 wherein, upon provision of voltage across the output terminals, the second gas discharge lamp ignites within a period of about 100 milli-seconds; and the first gas discharge lamp ignites some time after a period of about 100 milli-seconds.

22. The arrangement of claim 1 wherein, upon provision of voltage across the output terminals, the first gas discharge lamp ignites some time after the second gas discharge lamp has ignited.

23. The arrangement of claim 1 wherein: (i) each of the gas discharge lamps is an instant-start fluorescent lamp; and (ii) the first gas discharge lamp ignites at a time distinctly different from the time at which the second gas discharge lamp ignites.

24. An arrangement comprising:
a source providing a voltage across a pair of output terminals; the source having internal impedance means functional to limit to a certain maximum magnitude the current that can be drawn from the output terminals; and
plural instant-start gas discharge lamps series-connected across the output terminals;
the arrangement being functional to cause the gas discharge lamps to be ignited sequentially and in such manner that each lamp is ignited at a time that is distinctly different from the time at which each other lamp is ignited.

25. An arrangement comprising:
a source providing a voltage across a pair of output terminals; the source having internal impedance means functional to limit to a certain maximum magnitude the current that can be drawn from the output terminals;
plural instant-start gas discharge lamps series-connected across the output terminals; each lamp having a pair of lamp terminals; and
circuit means connected across the lamp terminals of each of at least two of the plural gas discharge lamps; the circuit means being operative to constitute a short circuit for a brief period of time, whereafter is becomes an open circuit.

26. An arrangement comprising:
a source providing a voltage across a pair of output terminals; the source having internal impedance means functional to limit to a certain maximum magnitude the current that can be drawn from the output terminals; and
plural gas discharge lamps being series-connected across the output terminals; each lamp having a pair of lamp terminals; and circuit means connected across the lamp terminals of each of the plural gas discharge lamps;

the arrangement being functional in such manner that, if one of the lamps were to be removed or otherwise were to fail to conduct current, each of the remaining lamps would be ignited and and would provide luminous output in an amount about equal to the amount of luminous output provided from it even if said one lamp had not been removed.

27. An arrangement comprising:

a source providing an output voltage across a pair of output terminals; the source having internal impedance means functional to limit to a certain maximum magnitude the current that can be drawn from the output terminals;

at least two instant-start gas discharge lamps series-connected across the output terminals; each lamp having a pair of lamp terminals; and circuit means connected across the lamp terminals of at least one of the gas discharge lamps; the circuit means being operative to constitute a short circuit for a brief period of time, whereafter is becomes an open circuit.

28. An arrangement comprising:

a source providing an output voltage across a pair of output terminals; the source having internal impedance means functional to limit to a certain maximum magnitude the current that can be drawn from the output terminals;

plural instant-start gas discharge lamps series-connected across the output terminals; an instant-start gas discharge lamp being defined as a gas discharge lamp having cathodes designed to permit lamp current to flow through the lamp prior to the cathodes having become incandescent; each lamp having a pair of lamp terminals; and circuit means connected across the lamp terminals of at least one of the gas discharge lamps; the circuit means being operative to constitute a short circuit for a brief period of time, whereafter is becomes an open circuit.

29. An arrangement comprising:

a source providing an output voltage across a pair of output terminals; the source having internal impedance means functional to limit to a certain maximum magnitude the current that can be drawn from the output terminals;

a number N of instant-start gas discharge lamps series-connected across the output terminals; each lamp: (i) having a pair of lamp terminals, and (ii) requiring for proper ignition that a lamp voltage of a certain minimum magnitude be provided across its lamp terminals;

electronic circuit means connected with at least some of the lamp terminals and functional to cause the lamps to be ignited even though the magnitude of the output voltage is substantially lower than N times the certain minimum magnitude.

* * * * *